(12) United States Patent
Foret

(10) Patent No.: US 9,127,206 B2
(45) Date of Patent: Sep. 8, 2015

(54) PLASMA WHIRL REACTOR APPARATUS AND METHODS OF USE

(71) Applicant: Foret Plasma Labs, LLC, The Woodlands, TX (US)

(72) Inventor: Todd Foret, The Woodlands, TX (US)

(73) Assignee: FORET PLASMA LABS, LLC, The Woodlands, TX (US)

( * ) Notice: Subject to any disclaimer, the term of this patent is extended or adjusted under 35 U.S.C. 154(b) by 0 days.

(21) Appl. No.: 14/308,805

(22) Filed: Jun. 19, 2014

(65) Prior Publication Data
US 2014/0299584 A1     Oct. 9, 2014

Related U.S. Application Data

(63) Continuation of application No. 13/746,152, filed on Jan. 21, 2013, now Pat. No. 8,796,581, which is a continuation of application No. 12/577,166, filed on Oct. 10, 2009, now Pat. No. 8,357,873, which is a
(Continued)

(51) Int. Cl.
*B23K 10/00*     (2006.01)
*C10B 23/00*     (2006.01)
(Continued)

(52) U.S. Cl.
CPC ............. *C10B 23/00* (2013.01); *B01J 19/088* (2013.01); *B01J 19/126* (2013.01); *B01J 19/129* (2013.01); *B01J 19/2405* (2013.01); *B23K 10/00* (2013.01);
(Continued)

(58) Field of Classification Search
CPC ............. H05H 1/42; H05H 1/48; H05H 1/24; H05H 1/34; C04B 1/04; C04B 18/0463; C04B 7/4453; C10B 23/00

USPC ............. 219/121.36, 121.43, 121.51, 121.48; 373/18–24; 110/250; 588/900
See application file for complete search history.

(56) References Cited

U.S. PATENT DOCUMENTS 1,698,096 A     1/1929 Hirschfeld
1,727,361 A     9/1929 Ashcraft
(Continued)

FOREIGN PATENT DOCUMENTS

CA     2304938 A1     2/2001
EP     0237216 A1     9/1987
(Continued)

OTHER PUBLICATIONS

BLRBAC: "Recommended Good Practice for the Thermal Oxidation of Waste Streams in a Black Liquor Recovery Boiler." Published Oct. 6, 1999.
(Continued)

*Primary Examiner* — Mark Paschall
(74) *Attorney, Agent, or Firm* — Daniel J. Chalker; Edwin S. Flores; Chalker Flores, LLP

(57) ABSTRACT

An apparatus for synergistically combining a plasma with a comminution means such as a fluid kinetic energy mill (jet mill), preferably in a single reactor and/or in a single process step is provided by the present invention. Within the apparatus of the invention potential energy is converted into kinetic energy and subsequently into angular momentum by means of wave energy, for comminuting, reacting and separation of feed materials. Methods of use of the apparatus in the practice of various processes are also provided by the present invention.

30 Claims, 15 Drawing Sheets

Related U.S. Application Data continuation-in-part of application No. 10/196,466, filed on Jul. 15, 2002, now Pat. No. 7,622,693.

(60) Provisional application No. 60/305,833, filed on Jul. 16, 2001.

(51) Int. Cl.

| | | |
|---|---|---|
| *B01J 19/12* | (2006.01) | |
| *B01J 19/24* | (2006.01) | |
| *C01B 3/24* | (2006.01) | |
| *C01B 3/34* | (2006.01) | |
| *C01B 17/04* | (2006.01) | |
| *C01B 17/58* | (2006.01) | |
| *C01F 7/06* | (2006.01) | |
| *C01F 11/18* | (2006.01) | |
| *C01F 11/24* | (2006.01) | |
| *C01F 11/46* | (2006.01) | |
| *C04B 7/44* | (2006.01) | |
| *C10J 3/54* | (2006.01) | |
| *C10J 3/56* | (2006.01) | |
| *C22B 4/00* | (2006.01) | |
| *D21C 11/12* | (2006.01) | |
| *C01B 3/22* | (2006.01) | |
| *H01J 37/32* | (2006.01) | |
| *H05H 1/42* | (2006.01) | |
| *B01J 19/08* | (2006.01) | |
| *C04B 18/04* | (2006.01) | |
| *H05H 1/44* | (2006.01) | |

(52) U.S. Cl.
CPC ... *C01B 3/22* (2013.01); *C01B 3/24* (2013.01); *C01B 3/342* (2013.01); *C01B 17/046* (2013.01); *C01B 17/58* (2013.01); *C01F 7/066* (2013.01); *C01F 11/18* (2013.01); *C01F 11/24* (2013.01); *C01F 11/46* (2013.01); *C04B 7/4453* (2013.01); *C04B 18/04* (2013.01); *C10J 3/54* (2013.01); *C10J 3/56* (2013.01); *C22B 4/005* (2013.01); *D21C 11/12* (2013.01); *H01J 37/32009* (2013.01); *H05H 1/42* (2013.01); *H05H 1/44* (2013.01); *B01J 2219/089* (2013.01); *B01J 2219/0892* (2013.01); *B01J 2219/0894* (2013.01); *C01B 2203/0238* (2013.01); *C01B 2203/0272* (2013.01); *C01B 2203/0861* (2013.01); *C10J 2200/09* (2013.01); *C10J 2300/093* (2013.01); *C10J 2300/0943* (2013.01); *C10J 2300/0946* (2013.01); *C10J 2300/0956* (2013.01); *C10J 2300/0959* (2013.01); *C10J 2300/0969* (2013.01); *C10J 2300/0973* (2013.01); *C10J 2300/0983* (2013.01); *C10J 2300/123* (2013.01); *C10J 2300/1238* (2013.01); *Y02E 50/32* (2013.01); *Y10S 588/90* (2013.01)

(56) References Cited

U.S. PATENT DOCUMENTS

| | | | | |
|---|---|---|---|---|
| 2,139,657 | A | | 12/1938 | Baeckler |
| 2,260,823 | A | | 3/1940 | Bettis |
| 2,705,219 | A | | 3/1955 | Heiskell et al. |
| 3,201,337 | A | | 8/1965 | Eichelberger et al. |
| 3,242,305 | A | | 3/1966 | Kane et al. |
| 3,254,770 | A | | 6/1966 | Herndon |
| 3,292,028 | A | | 12/1966 | Van Ornum |
| 3,324,334 | A | | 6/1967 | Reed |
| 3,428,125 | A | | 2/1969 | Parker |
| 3,567,921 | A | | 3/1971 | Holiday |
| 3,769,517 | A | | 10/1973 | Coleman |
| 3,772,172 | A | | 11/1973 | Zhagatspanian et al. |
| 3,826,920 | A | | 7/1974 | Woodroffe et al. |
| 3,917,479 | A | | 11/1975 | Sayce et al. |
| 3,924,246 | A | | 12/1975 | Scherer |
| 3,958,636 | A | | 5/1976 | Perkins |
| 3,998,477 | A | | 12/1976 | Delahaye et al. |
| 4,002,918 | A | | 1/1977 | Graentzel |
| 4,018,973 | A | * | 4/1977 | Paton et al. .................. 373/18 |
| 4,279,743 | A | | 7/1981 | Miller |
| 4,296,066 | A | | 10/1981 | Schenck |
| 4,317,041 | A | | 2/1982 | Schenck |
| 4,344,483 | A | | 8/1982 | Fisher et al. |
| 4,381,978 | A | | 5/1983 | Gratzel et al. |
| 4,382,469 | A | | 5/1983 | Bell et al. |
| 4,397,823 | A | | 8/1983 | Dimpfl |
| 4,427,636 | A | | 1/1984 | Obenshain |
| 4,448,935 | A | | 5/1984 | Iovine et al. |
| 4,454,835 | A | | 6/1984 | Walsh et al. |
| 4,476,105 | A | | 10/1984 | Greenbaum |
| 4,477,283 | A | | 10/1984 | Wilson, Sr. |
| 4,488,935 | A | | 12/1984 | Ruhe |
| 4,508,040 | A | * | 4/1985 | Santen et al. .................. 110/347 |
| 4,530,101 | A | * | 7/1985 | Fey et al. .................. 373/19 |
| 4,544,470 | A | | 10/1985 | Hetrick |
| 4,554,435 | A | * | 11/1985 | Wolf et al. .................. 219/383 |
| 4,622,115 | A | | 11/1986 | O'Neill |
| 4,626,648 | A | | 12/1986 | Browning |
| 4,670,048 | A | * | 6/1987 | Pineau .................. 75/10.19 |
| 4,761,793 | A | | 8/1988 | Digne et al. |
| 4,774,026 | A | | 9/1988 | Kitamori et al. |
| 4,803,365 | A | | 2/1989 | Krause et al. |
| 4,863,608 | A | | 9/1989 | Kawai et al. |
| 4,868,127 | A | | 9/1989 | Blades et al. |
| 4,948,980 | A | | 8/1990 | Wedekamp |
| 4,957,773 | A | | 9/1990 | Spencer et al. |
| 4,998,486 | A | * | 3/1991 | Dighe et al. .................. 110/346 |
| 5,015,432 | A | | 5/1991 | Koloc |
| 5,019,256 | A | | 5/1991 | Ifill et al. |
| 5,045,288 | A | | 9/1991 | Raupp et al. |
| 5,094,815 | A | | 3/1992 | Conboy et al. |
| 5,120,450 | A | | 6/1992 | Stanley, Jr. |
| 5,124,131 | A | | 6/1992 | Wekhof |
| 5,126,111 | A | | 6/1992 | Al-Ekabi et al. |
| 5,149,377 | A | | 9/1992 | Esrom et al. |
| 5,166,950 | A | | 11/1992 | Jouvaud et al. |
| 5,200,156 | A | | 4/1993 | Wedekamp |
| 5,227,053 | A | | 7/1993 | Brym |
| 5,243,169 | A | * | 9/1993 | Tateno et al. .................. 219/121.51 |
| 5,403,399 | A | | 4/1995 | Kurihara et al. |
| 5,413,768 | A | | 5/1995 | Stanley, Jr. |
| 5,439,595 | A | | 8/1995 | Downey, Jr. |
| 5,439,652 | A | | 8/1995 | Sczechowski et al. |
| 5,451,738 | A | | 9/1995 | Alvi et al. |
| 5,472,567 | A | | 12/1995 | Torregrossa |
| 5,529,701 | A | | 6/1996 | Grisham et al. |
| 5,531,904 | A | | 7/1996 | Grisham et al. |
| 5,611,896 | A | | 3/1997 | Swanepoel et al. |
| 5,637,127 | A | * | 6/1997 | McLaughlin et al. .................. 65/134.8 |
| 5,662,811 | A | | 9/1997 | Grisham et al. |
| 5,664,733 | A | | 9/1997 | Lott |
| 5,680,014 | A | * | 10/1997 | Miyamoto et al. .................. 315/111.41 |
| 5,696,380 | A | | 12/1997 | Cooke et al. |
| 5,730,875 | A | | 3/1998 | Grisham et al. |
| 5,738,281 | A | * | 4/1998 | Zurecki et al. .................. 239/290 |
| 5,832,361 | A | | 11/1998 | Foret |
| 5,843,211 | A | | 12/1998 | Bielefeldt |
| 5,866,910 | A | | 2/1999 | Cooke et al. |
| 5,994,705 | A | | 11/1999 | Cooke et al. |
| 6,004,386 | A | | 12/1999 | Grisham et al. |
| 6,019,947 | A | | 2/2000 | Kucherov |
| 6,054,097 | A | | 4/2000 | Mass et al. |
| 6,090,296 | A | | 7/2000 | Oster |
| 6,117,401 | A | | 9/2000 | Juvan |
| 6,182,585 | B1 | * | 2/2001 | Gonopolsky et al. .................. 110/346 |
| 6,187,206 | B1 | | 2/2001 | Bernier et al. |
| 6,228,266 | B1 | | 5/2001 | Shim |
| 6,355,178 | B1 | * | 3/2002 | Couture et al. .................. 210/748.05 |
| 6,362,449 | B1 | | 3/2002 | Hadidi et al. |
| 6,377,602 | B1 | * | 4/2002 | Aita et al. .................. 373/66 |

(56) References Cited

U.S. PATENT DOCUMENTS

| | | |
|---|---|---|
| 6,410,880 B1 | 6/2002 | Putvinski et al. |
| 6,565,803 B1 | 5/2003 | Bolton et al. |
| 6,630,113 B1 | 10/2003 | Surma |
| 6,693,253 B2 | 2/2004 | Boulos et al. |
| 6,713,771 B2 | 3/2004 | Nakagawa et al. |
| 6,987,792 B2 | 1/2006 | Do et al. |
| 7,422,695 B2 | 9/2008 | Foret |
| 7,578,937 B2 | 8/2009 | Foret |
| 7,622,693 B2 | 11/2009 | Foret |
| 7,857,972 B2 | 12/2010 | Foret |
| 7,882,646 B2 | 2/2011 | Gorbell et al. |
| 7,897,053 B2 | 3/2011 | Foret |
| 7,905,942 B1 | 3/2011 | Layman |
| 7,985,342 B2 | 7/2011 | Foret |
| 8,002,992 B2 | 8/2011 | Foret |
| 8,088,290 B2 | 1/2012 | Foret |
| 8,110,100 B2 | 2/2012 | Foret |
| 8,263,897 B2 | 9/2012 | Morrisroe |
| 8,324,523 B2 | 12/2012 | Foret |
| 8,329,044 B2 | 12/2012 | Foret |
| 8,337,709 B2 | 12/2012 | Foret |
| 8,338,709 B2 | 12/2012 | Kodama et al. |
| 8,343,342 B2 | 1/2013 | Foret |
| 8,357,873 B2 | 1/2013 | Foret |
| 8,366,925 B2 | 2/2013 | Foret |
| 8,597,523 B2 | 12/2013 | Foret |
| 8,641,898 B2 | 2/2014 | Foret |
| 2001/0046964 A1 | 11/2001 | Percel et al. |
| 2001/0047964 A1 | 12/2001 | Matherly et al. |
| 2003/0150325 A1 | 8/2003 | Hyppanen |
| 2004/0020188 A1 | 2/2004 | Kramer et al. |
| 2005/0013772 A1 | 1/2005 | Patton et al. |
| 2006/0104849 A1 | 5/2006 | Tada |
| 2006/0163054 A1 | 7/2006 | Spitzl et al. |
| 2006/0252974 A1 | 11/2006 | McVey et al. |
| 2007/0102152 A1 | 5/2007 | Forgeron |
| 2007/0253874 A1 | 11/2007 | Foret |
| 2008/0058228 A1 | 3/2008 | Wilson |
| 2009/0277774 A1 | 11/2009 | Foret |
| 2010/0212498 A1 | 8/2010 | Salazar |
| 2012/0097648 A1 | 4/2012 | Foret |
| 2012/0227968 A1 | 9/2012 | Eldred et al. |

FOREIGN PATENT DOCUMENTS

| | | |
|---|---|---|
| KR | 10-2004-0005107 | 1/2004 |
| RU | 2102587 C1 | 1/1998 |
| WO | 94/16809 | 8/1994 |
| WO | 99/04607 | 1/1999 |

OTHER PUBLICATIONS

NISTIR 6341 "Simulating Fire Whirls".
NISTIR 6427 "The Fluid Dynamics of Whirls—An Inviscid Model".
PCT/US2014/2014/024991 [KIPO] International Search Report dated Aug. 6, 2014.
International Search Report and Written Opinion for PCT/US2009/033979 dated Sep. 15, 2009.
International Search Report and Written Opinion for PCT/US2007/008529 dated Jun. 11, 2008.
International Search Report and Written Opinion for PCT/US2007/008640 dated Sep. 25, 2007.
Lectures: On Illuminating Engineering Delivered at The John Hopkins University, Published 1911 Johns Hopkins Press, p. 140.
European Search Report 07755050.7 dated Dec. 29, 2011.
PCT/US2013/074506 [KIPO] International Search Report dated Mar. 18, 2014.
Extended European Search Report 08840081 dated May 21, 2014.

* cited by examiner

PLASMA WHIRL REACTOR APPARATUS AND METHODS OF USE

CROSS REFERENCE TO RELATED APPLICATIONS

This patent application is a continuation patent application of U.S. patent application Ser. No. 13/746,152 filed on Jan. 21, 2013, now U.S. Pat. No. 8,796,581, and entitled "Plasma Whirl Reactor Apparatus and Methods of Use", which is a continuation patent application of U.S. patent application Ser. No. 12/577,166 filed on Oct. 10, 2009, now U.S. Pat. No. 8,357,873, and entitled "Plasma Whirl Reactor Apparatus and Methods of Use", which is a continuation patent application of U.S. patent application Ser. No. 10/196,466 filed on Jul. 15, 2002, now U.S. Pat. No. 7,622,693, and entitled "Plasma Whirl Reactor Apparatus and Methods of Use" which is a non-provisional patent application of U.S. provisional patent application 60/305,833 filed on Jul. 16, 2001. All of the foregoing patent applications are hereby incorporated by reference in their entirety.

This patent application is also related to U.S. Pat. No. 8,324,523, U.S. patent application Ser. No. 13/215,207 filed on Aug. 22, 2011 and entitled "Method for Treating a Substance with Wave Energy from Plasma and an Electrical Arc", and U.S. patent application Ser. No. 13/215,223 filed on Aug. 22, 2011 and entitled "Apparatus for Treating a Substance with Wave Energy from Plasma and an Electrical Arc", and U.S. patent application Ser. No. 13/746,193 filed on Jan. 21, 2013, now U.S. Pat. No. 8,785,808, and entitled "Plasma Whirl Reactor Apparatus and Methods of Use", and other patents and patent application by the same inventor.

FIELD OF THE INVENTION

The present invention generally relates to apparatus and methods for processing materials with plasma.

BACKGROUND OF THE INVENTION

Worldwide solid waste production is increasing at an alarming rate. Solid waste ranges in size, shape and material. Non-limiting examples of high volume solid wastes include:
1. household garbage and trash (Municipal Solid Waste);
2. drill cuttings produced during the drilling of an oil or gas well;
3. wastewater treatment plant sludge;
4. medical waste;
5. unburned carbon on fly ash and coal fines;
6. red mud which is the remaining bauxite waste from alumina production;
7. obsolete computers and electronic equipment (Waste from Electrical and Electronic Equipment);
8. saw dust and wood chips;
9. bagasse from sugar mills;
10. rice straw;
11. animal manure;
12. radioactive hazardous wastes produced from manufacturing nuclear material for nuclear, power plants and nuclear weapons.

Worldwide gaseous waste emissions are also increasing at an alarming rate. Worldwide natural gas production in 1998 exceeded 101,891 billion cubic feet (bcf). However, over 3.7% or 3,724 bcf of the produced gas was flared or vented worldwide. The vented or flared gas is a wasted and untapped source of energy. The United States' Greenhouse Gas (GHG) releases for natural gas flared in 1998 was about 3.9 million metric tons of carbon equivalents (MMTCE).

Also, total U.S. greenhouse gas emissions rose in 1998 to 1,834.6 MMTCE, which is 11.2% above the 1990 baseline of 1,649.7 MMTCE. $CO_2$ from fossil fuel combustion, which is the largest source of U.S. greenhouse gas emissions, accounted for 80% of weighted emissions in 1998. Emissions from this source grew by 11% (148.1 MMTCE) from 1990 to 1998 and were also responsible for over 80% of the increase in national emissions during this period.

The most common greenhouse gases are carbon dioxide, methane, nitrogen oxides and ozone depleting substances. In 1998, methane emissions resulted primarily from the decomposition of wastes in landfills, manure and enteric fermentation associated with domestic livestock, natural gas systems, and coal mining. Emissions of $N_2O$ were dominated by agricultural soil management and mobile source fossil fuel combustion.

Particulate matter is another gaseous emission that can be considered a solid waste. Particulate matter is emitted from coal burning power plants, diesel engines, incinerators and the burning of biomass, such as rice straw, wood, bagasse and charcoal. Particulate matter is of concern because very small particles may not be able to be filtered out by the respiratory system of a mammal.

Municipal Solid Waste

Municipal solid waste (MSW), more commonly known as trash or garbage, consists of everyday items such as product packaging, grass clippings, furniture, clothing, bottles, food scraps, newspapers, appliances, paint, and batteries. In 1996, U.S. residents, businesses, and institutions produced more than 209 million tons of MSW, which is approximately 4.3 pounds of waste per person per day, up from 2.7 pounds per person per day in 1960. However, the number of landfills in the U.S. dropped from almost 8,000 in 1988 to about 2,314 in 1998.

Twenty-seven percent (27%) of MSW was recovered and recycled or composted, 17% was burned at combustion facilities, and the remaining 55% was disposed of in landfills. It is projected that by the year 2005 the U.S. will produce almost 240 million tons of MSW, with paper and paperboard to the dominant material.

Although 17% of the MSW was incinerated in 1996, it is highly unlikely that incineration will be the technology of choice for alleviating landfill disposal. For example, in November 2000, the U.S. EPA released its final ruling regarding incineration of medical waste. It is believed that due to the new regulations regarding the formation and subsequent release of dioxins from medical waste incinerators, more than 80% of the medical waste incinerators will be decommissioned within the U.S. Likewise, since MSW contains precursor chlorine molecules, regulations regarding incineration emissions from landfills may follow in step with medical waste incinerator emission regulations.

It is evident that an urgent need exists to eliminate or reduce the amount of MSW disposed of in landfills in addition to reclaiming the waste within the landfill. Also, many industrial and municipality wastewater treatment plants will dispose sludge in landfills for a nominal charge more commonly referred to as a "tipping fee." It would be extremely beneficial to both society and to industrial plants or municipalities if this sludge could be recovered onsite as energy in lieu of transporting it to a landfill for final deposition into the ground. A technology that would allow a plant to achieve substantially zero discharge of solid wastes would be highly beneficial.

Oil and Gas Well Drill Cuttings

Another industry, which can benefit from a process or apparatus which could achieve substantially zero discharge for wastes, is the oil and gas industry. When an oil or gas well is drilled, the material that is left over from the "hole in the ground" is referred to as drill cuttings. Typically, for every foot drilled about 1.2 barrels of drill cuttings are produced per well. The disposal of the separated shale and cuttings is a complex environmental problem. Drill cuttings contain not only the mud product that can contaminate the environment, but also typically contain oil that is particularly hazardous to the environment, especially when drilling in a marine environment.

For example, in the Gulf of Mexico, there are hundreds of drilling platforms that drill for oil and gas by drilling into the sub-sea floor. These drilling platforms can be in many hundreds of feet of water. In such a marine environment, the water is typically crystal clear and filled with marine life that cannot tolerate the disposal of drill cuttings. Therefore, there is a need for a simple, yet workable solution to the problem of disposing of oil and gas well cuttings in an offshore marine environment as well as in other fragile environments where oil and gas well drilling occurs.

Traditional methods of cuttings disposal from an offshore rig usually involves the following procedures and associated costs:
1. Drill cuttings are conveyed from shale shaker to cutting boxes (cutting box rental);
2. Drill cuttings are conveyed to supply boat tank and transported to dock facility (supply boat used to transfer cuttings to dock);
3. Drill cuttings are removed from tanks by emulsifying with water or via bucket brigade (dockside cleaning of tanks; tank cleaning crew=$165/hour);
4. Drill cuttings and water are transferred to an injection well facility; and
5. Drill cuttings are injected down-hole at an injection well facility for final disposal ($8/barrel).

Thus, drill cuttings disposal cost has been estimated to be between $20 and $30 per barrel.

Unburned Carbon on Fly Ash and Coal Fines

Another solid waste produced in very large tonnages can be found in the coal industry. Coal burning power plants that have low NOx burners produce a fly ash that has a relatively high loss on ignition (LOI) carbon content. Fly ash having an unburned carbon content greater than about 6% usually cannot be used as a cement additive. In addition, washing coal produces coal fines that are traditionally disposed of in a pond. A simple one-step process that can treat fly ash and coal fines, or gasify coal without any pretreatment such as washing and grinding would help eliminate many problems associated with coal burning power plants.

The U.S. Department of Energy's National Energy Technology Lab (NETL) has estimated that as much as 2 to 3 billion tons of coal fines lie in waste impoundments at mines and washing plants around the country. Each year, another 30 million tons of coal mined in the United States is discarded into these waste ponds.

Olefin Plants, Ethylene and Propylene

Unburned or unreacted carbon has plagued several other industries and/or processes, such as olefin plants in the petrochemical industry. Olefin plants usually have two main sections: a pyrolysis or cracking section, and a purification or distillation section. In the production of ethylene, ethane is cracked in the presence of steam to produce an ethylene rich feedstock that can then be fed to an ethylene oxide plant. A hydrogen end-user, such as a refinery or cyclohexane plant is typically located near an olefin plant. Normally, these plants are integrated into a complex petrochemical facility.

The petrochemical industry, as well as the refining industry, has been plagued with Volatile Organic Carbon (VOC) emission releases, as well as solid waste release problems. Owing to the global warming issue, solutions are being sought for mitigating point source carbon dioxide releases.

A technology that could remove, or decompose of, ethylene oxide in a carbon dioxide stream would be highly desirable to the olefins industry. Likewise, a simple one-step reactor and method that could utilize $CO_2$ to treat solid wastes, or other releases in an olefin plant or refinery, would be highly desirable. For example, a simple, cost efficient and highly reliable process that could utilize contaminated $CO_2$ emissions produced from a process, such as in the production of ethylene oxide (EO), in combination with eliminating flares from the same plant would also be extremely and desirable.

Flares

Flares are common in many petrochemical plants, refineries, oil and gas wells and production facilities, and small commercial chemical plants. Typically, a flare is employed in order to vent a material such as VOCs during plant upsets. For example, an ethylene oxide plant may send its feedstock stream, or a portion thereof, to a flare during temporary shutdowns or plant upsets. A flare is a gaseous waste source and is also a point source emission that is strictly regulated by the U.S. EPA as well as state and local environmental agencies.

In lieu of plant upsets or shutdowns, flares can be used for the burning of low quality gas that does not meet pipeline specifications. One such low quality gas is biogas that is produced from landfills and which is usually flared or vented. Biogas is typically comprised of methane and $CO_2$ as well as trace amounts of water, sulfur compounds and chlorinated compounds. A valuable resource is being wasted by flaring such a gas with the end product being carbon dioxide, a green house gas, with the potential for releasing toxic emissions. A process that could eliminate flares, provide substantially zero discharge and produce a valuable chemical feedstock would be highly beneficial.

The U.S., as well as the rest of the world, are in need of a simple solution, such as that provided by the instant invention, for eliminating waste releases. Likewise, due to the rising costs of oil and gas, in addition to aging refineries and petrochemical plants coupled with a population increase, there exists an immediate need for the production of cleaner fuels and/or processes that do not require world-class size refineries and plants.

A relatively small, portable, modular and efficient industrial chemical reactor with a high throughput and yield would be desirable to the aforementioned applications and industries. Likewise, a small residential chemical reactor that could treat household garbage or yard trimmings onsite would dramatically reduce disposal of solid wastes into landfills. An example of the top four materials generated from households for 2000 and projected for 2005 respectively, are:

| | Millions of tons (% of total) | |
| --- | --- | --- |
| Material | 2000 | 2005 |
| Paper & Paperboard | 87.7 (39.3%) | 94.7 (39.7%) |
| Plastics | 23.4 (10.5%) | 26.7 (11.2%) |
| Food Wastes | 22.5 (10.1%) | 23.5 (9.8%) |
| Yard Trimmings | 23 (10.3%) | 23 (9.6%) |

The petrochemical and refining industries could benefit from a process that could easily convert MSW in one single reactor into syngas (CO and $H_2$). Such a process, if available, would provide substantially zero emissions from a landfill, as well as eliminate future disposal into landfills while supplying a highly desirable and limited feedstock—hydrogen and carbon monoxide—to refineries via pipelines.

Refinery Coke

Many crude oil refineries produce coke, which is a solid at room temperature and is the bottom of the barrel, or the remaining carbon from the barrel of crude oil. As previously stated, refineries are in need of hydrogen. This is partially due to regulations requiring the production of reformulated gasoline. In addition, with the new low-sulfur diesel regulations on the horizon, vast amounts of hydrogen will be required for hydro-treating processes used in refineries to reduce the heteroatom content of fuel products. In combination with rising natural gas prices, refineries will look upon new processes that do not require the steam reforming of methane for the production of hydrogen. Such a process, or apparatus, must be capable of utilizing wastes found within a refinery, such as waste oil from the Oil and Water Separator, sludge from the wastewater treatment plant, and coke.

The apparatus must be capable of handling extremely high flow rates, as well as being portable and modular. Many oil and gas companies are finding it uneconomical to fund conventional process units utilizing steel and concrete. For example, many refineries are turning to over-the-fence (OTF) contracts for meeting their hydrogen requirements instead of building on-site hydrogen plants. Likewise, refineries are ever more willing to lease or rent rapidly deployable modular units that can be mobilized as and where needed. A rapidly deployable single-stage reactor that can convert refinery waste, such as coke, waste oil and sludge to a valuable chemical feedstock, such as syngas, would be extremely valuable to the oil and gas refining industry.

Sulfuric Acid Regeneration

The demand for high-octane/low-vapor-pressure gasoline blending components has increased dramatically within the past few years, primarily as a result of the 1990 U.S. EPA Clean Air Act Amendments. Hydrocarbon sulfuric acid alkylation is one of the most important refinery processes for producing gasoline-blending components having high octane/low-vapor-pressure. Alkylation converts lighter petroleum hydrocarbons into heavier hydrocarbons. A typical refinery will utilize sulfuric acid ($H_2SO_4$) as the catalyst in it's' alkylation process. The sulfuric acid is used as a catalyst to transform propylene, butylene and/or isobutane into alkylation products, or alkylate. The downside of the alkylation process is that a "spent acid" product stream is produced that is typically comprised of greater than about 90 wt. % $H_2SO_4$, 5 wt. % water, 4 wt. % organics, and less than about 1 wt. % in solids.

Sulfuric acid is also used in reactions such as sulfonation and nitration, as well as for other uses such as drying, pickling etc. At the end of these processes, the sulfuric acid remains in a form that is unusable and that needs to be recovered or disposed. This sulfuric acid waste stream is commonly referred to as spent acid or spent sulfuric acid. The spent acid can be processed to recover usable sulfuric acid by a number of processes including the process of regeneration.

For example, a Sulfuric Acid Regeneration ("SAR") plant can be used and typically comprises a furnace, a gas cleaning section, a converter, and an absorption unit. Sulfuric acid is decomposed into sulfur dioxide, carbon dioxide, water, and nitrogen in the furnace in the presence of a fueled combustion flame. This is generally referred to as the regeneration or "regen furnace".

The gas cleaning section of the typical SAR plant eliminates particulates, residual $SO_3$, metal contaminants, and most of the water from the regen furnace effluent. The converter is typically provided to react $SO_2$ with oxygen from air to produce $SO_3$, which can then be hydrated in the absorption tower to form sulfuric acid.

Spent sulfuric acid in a petroleum refinery is typically a large volume Toxic Release Inventory chemical that is strictly regulated for off-site transfer for regeneration or disposal. Thus, many refineries recycle the spent acid onsite. This process is more commonly referred to as "Spent Acid Regeneration" or SAR.

As previously mentioned, the SAR process comprises combusting spent acid with a fuel. Fuels are normally selected from streams commonly found in a refinery such as natural gas, to residual oil to hydrogen sulfide. The downside of the SAR combustion process is that the oxygen used for combustion must be fed to the furnace very precisely in order to achieve proper combustion while limiting the amount of air in the stream. Overfeeding air or oxygen increases the furnaces gas volume. As a result, equipment must be sized in order to compensate for a plant upset or overfeeding combustion air. Additionally, overfeeding air may affect conversion of $SO_2$ to $SO_3$ as well as absorption of $SO_3$ in the absorbing tower.

The refining industry is in need of a process for regenerating spent acid that does not require combustion with a fuel and oxidant. Such a process would allow a SAR plant to be dramatically downsized owing to the elimination of combustion products, such as water and $CO_2$, that represent a relatively large volume of the gaseous stream.

Spent (contaminated) sulfuric acid is generated in various other chemical production processes such as titanium dioxide production, methyl methacrylate production, and various nitration processes. Spent sulfuric acid from these processes has been disposed of, other than by SAR, by either deep well injection, or neutralization and discharge of the spent sulfuric acid into water ways, oceans or landfills.

Regeneration of spent sulfuric acid is two to three times as expensive as acid made directly made from sulfur. The disposal of spent sulfuric acid is an ever increasing problem because of environmental regulations that are becoming more and more stringent. At the same time, the demand for alkylates in unleaded gasoline is increasing, thus creating more spent sulfuric acid.

In an attempt to regenerate increasing amounts of spent sulfuric acid, oxygen enrichment of combustion air has been used to increase the capacity of a given regeneration facility. Use of oxygen enriched air permits more acid to be processed in an existing facility thereby improving the process economics to a certain degree. The combustion that is normally carried out with air, which contains 21% oxygen with the remainder being nitrogen, puts nitrogen into the process, which plays no useful role in the waste combustion but leads to heat losses in the stack and reacts with oxygen to produce nitrogen oxides (known as thermal NOx), which in turn leads to smog formation, ozone depletion in the atmosphere and acid rain.

The formation of thermal NOx is extremely temperature sensitive. By enriching the combustion air to approximately 28% oxygen, the number of oxygen molecules available for combustion can be increased by 25% without increasing the volume of combustion air or flue gas. Hence, the waste processing capacity of a furnace can be increased. However, this approach has not been widely adopted in the market place because oxygen enrichment leads to an increase in the furnace flame temperature, including localized hot spots. These hot spots have a detrimental effect on the materials of construction of the combustor and oxygen constitutes an additional cost of production that the regeneration facility has to incur. The extra cost for the oxygen is partially offset by the increased amount of acid processed in a given facility.

Claus Plant

Claus-type plants are in use in refineries to treat gases containing hydrogen sulfide. The typical Claus plant comprises at least one furnace, or "thermal reactor", and multiple converters. Elemental sulfur is produced as well as a "tail gas" comprising residual unconverted hydrogen sulfide, other minor sulfur compounds, sulfur dioxide and inert gases. Some Claus plants may also comprise more than a single thermal reactor. Claus plant performance and capacity have been increased by the utilization of an oxygen-enriched air in the furnace. For example see EP 0237 216 A1 published Sep. 16, 1987, which discloses one such modified Claus process using oxygen-enriched air.

While faced with the need to expand capacity, refineries are often limited by both physical space and environmental restraints from expanding capacity of these process units, for example, by the addition of furnaces or converters.

Upgrading Crude at the Wellhead

Many crudes are of very low quality due to sulfur contamination. As previously stated, refineries will have to make dramatic and costly capital investments in order to process low quality crudes, such as those produced in Mexico and Venezuela. Also, additional expenditures will be required for increased hydro-treating capacity in order to produce low sulfur distillates. The U.S. EPA estimates the cost of reducing the sulfur content of diesel fuel will result in a fuel price increase of approximately 4.5 to 5 cents per gallon.

A simple and economical solution for the refining industry is to upgrade crude at the wellhead. This will result in a higher quality crude oil that will demand a relatively high price. Thus, both the refinery, as well as the public, will benefit since a refinery would not have to make major and costly modifications to their hydro-treating process units and pass the costs to consumers.

A process or apparatus, such as that of the instant invention, that can upgrade crude oil at the wellhead by converting casing-head gas to hydrogen, while reducing down-hole back pressure, thus increasing oil production from the well, would be highly desirable.

Animal Feed Operations

Another industry that produces a solid waste that has become a disposal problem is the agriculture industry. For example, animal feeding operations (AFO) produce large amounts of manure that runs off into local waterways creating a pollution problem. Phosphorous in the animal waste has been linked to causing hypoxia in receiving waters. Sludge from drinking water plants that contains lime and iron has been suggested as an additive to animal waste to chelate the phosphorous. Also, Red Mud from aluminum production facilities has been suggested as an alternative additive to animal waste. Transportation costs for hauling these additives to the farm, or the animal waste to the site where the additive is produced, is cost prohibitive.

Aluminum, Energy, Red Mud and Carbon Sequestration

On Apr. 11, 2001, the Bonneville Power Administration (BPA) began to implement a proposal to shutter the U.S. Northwest's ten aluminum smelters for up to two years. The BPA called on aluminum officials to close Northwest smelters to help hold down soaring energy prices in the Northwest and in California. Many smelters in the BPA region had already closed their doors because high energy prices made aluminum production unprofitable. The current plan would freeze the Northwest Aluminum Industry that is responsible for 38% of the U.S.'s aluminum production in smelters throughout Washington, Oregon and Montana. The ten smelters consume 1,500 megawatts of power, enough electricity to light all of Seattle. BPA can only produce 8,000 megawatts.

The production of aluminum starts with the mining of bauxite ore which is crushed and ground at the aluminum plant to the desired size for efficient extraction of alumina ($Al_2O_3$) through digestion with hot sodium hydroxide liquor. The hot sodium hydroxide extraction process is more commonly referred to as the "Bayer Process." A portion of the liquor that is removed from the alumina in the Bayer process is referred to as "red mud." After removal of "red mud" and fine solids from the process liquor, alumina is produced by precipitating aluminum trihydrate crystals and then calcining the crystals in a rotary kiln or fluidized bed calciner.

It is typical for one aluminum plant to produce more than 1,000,000 tons of red mud per year. The red mud is typically stockpiled on-site since, resulting in the accumulation of ever-increasing amounts of red mud at the plant site. Some work is being conducted to develop useful products from the red mud. One such product, Cajunite, is an absorbent for liquid wastes.

Red mud is typically comprised of about 50 wt. % water, and about 50 wt. % components that are not soluble in sodium hydroxide (by mass %: $Al_2O_3$ 22-28%, $Fe_2O_3$ 25-35%, $SiO_2$ 6-16%, $TiO_2$ 8-24%, $Na_2O$ (total) 4-9%, $Na_2O$ (soluble) 0.5-0.7%, CaO+MgO 0.5-4%, LOI 7-12%). Between 0.7-2 tons of red mud are produced for every ton of alumina extracted, depending on the composition of the bauxite. The two basic methods of onsite disposal are "wet discharge" (dumping of the water mud in lakes) and "dry stacking" (landfill of the dried, thickened red mud).

In combination with rising energy costs and environmental issues, the aluminum industry is in great need of technologies for producing clean fuel or energy while simultaneously producing a useful byproduct from red mud.

Automobile Shredder Residue (Fluff) and Aluminum Recycling

Automobile shredder residue, or fluff, is the material remaining after recovering the metals from a shredded vehicle. Current recovery technologies includes shredding the vehicle, removing ferrous metal with a magnet, then separating the remaining metals by means of dense medium separation. Simply, the shredded material is placed in rotating drums filled with a liquid media. The media may be water or water that is weighted-up, similar to drilling mud. By changing the density of the liquid, some material will float while some material will sink.

The major problem with such a process is that the process requires copious amounts of water. Hence, since the vehicle contains organic fluids such as lubricants, antifreeze, motor oil and gasoline, an undesirable emulsion is formed with the water. Expensive water treatment chemicals are then utilized to break the emulsion as well as to prevent foaming and frothing which upsets the dense medium separation process. The remaining non-metallic portion of the vehicle is the fluff. Typically, fluff is comprised of light organics, heavy organics such as plastics, foam, and rubber. The fluff can be a valuable feedstock or fuel but typically ends up in a landfill.

Another problem associated with organic fluids forming emulsions in the dense medium separation process is that the metals may be covered or coated with organic fluids. This in itself presents a recycling problem. Although the price of the metals is not affected, the metals recycling facility must take precautions due to the potential for emissions of the organic fluids.

This problem is more common with aluminum ingot manufacturing from aluminum turnings from machine shops and fabrication facilities. The cutting oil on the aluminum turnings must be removed in order to process the aluminum turnings. This problem has plagued aluminum recycling facilities. Likewise, the paint on aluminum cans present a problem when recycling aluminum cans. European regulators have enacted "take back laws" which will require vehicle manufactures to take back vehicles after their useful life. In addition, the regulations will limit the amount of fluff that can be disposed of in a landfill. In accordance with the regulations, the percentage of fluff that can be land-filled will decrease over a time period.

The automotive industry, as well as the aluminum recycling industry, is in great need of a technology that can easily convert the fluff, cutting oil or paint to a useful feedstock or fuel while recovering a very clean metal stream for recycling.

Waste from Electrical and Electronic Equipment (WEEE)

The production of electrical and electronic equipment is one of the fastest growing domains of manufacturing industry in the Western world. Both technological innovation and market expansion continue to accelerate the replacement process. New applications of electrical and electronic equipment are increasing significantly. There is hardly any part of life where electrical and electronic equipment are not used. This development leads to an important increase in waste electrical and electronic equipment (WEEE).

The WEEE stream is a complex mixture of materials and components. In combination with the constant development of new materials and chemicals having environmental effects, this leads to increasing problems at the waste stage. The WEEE stream differs from the municipal waste stream for a number of reasons:

1. The rapid growth of WEEE is of concern. In 1998, in Europe, 6 million metric tons of waste from electrical and electronic equipment were generated (4% of the municipal waste stream). The volume of WEEE is expected to increase in Europe by at least 3-5% per annum. This means that in five years 16-28% more WEEE will be generated and in 12 years the amount will have doubled. The growth of WEEE is about three times higher than the growth of the average municipal waste.
2. Because of their hazardous content, electrical and electronic equipment cause major environmental problems during the waste management phase if not properly pre-treated. As more than 90% of WEEE is land-filled, incinerated or recovered without any pretreatment, a large proportion of various pollutants found in the municipal waste stream comes from WEEE.
3. The environmental burden due to the production of electrical and electronic products ("ecological baggage") exceeds by far the environmental burden due to the production of materials constituting the other substreams of the municipal waste stream. As a consequence, enhanced recycling of WEEE should be a major factor in preserving resources, in particular energy.

In view of the environmental problems related to the management of WEEE, European Member States began drafting national legislation in this area. The Netherlands, Denmark, Sweden, Austria, Belgium and Italy have already presented legislation on this subject. Finland and Germany are expected to do so soon.

For example, a semiconductor company that designs, develops, manufactures and markets a broad range of semiconductor integrated circuits ("ICs") and discrete devices will lists its package material in its products. Such semiconductor products can include MPEG-2 decoder ICs, Digital Set-Top Box ICs, special automotive ICs, MCV-based smartcard ICs and EPROM non-volatile memories and are also the second leading supplier of analog and mixed-signal ASSPs and ASICs, disk drive ICs and EEPROM memories.

1. Package materials—The material of the package can be:
    a. Plastic—The plastics used are mainly transfer-mold epoxy cresol novolac (ECN-Epoxy resin) or Polyurethanic resin for the modules. The filler of these resins is $SiO_2$ (about 70%). The epoxy resins used will typically contain antimony trioxide ($Sb_2O_3$) and tetrabromobisphenol-A as flame retardants. After curing the tetrabromobisphenol-A is no longer free because it is incorporated into the epoxy polymer. The tables report the percentage of bromium in the epoxy polymer (about 1%) and the amount of antimony trioxide (about 2%).
    b. Ceramic—The ceramic used for the RF transistors will typically be BeO and is alumina ($Al_2O_3+SiO_2$) for the integrated circuits.
    c. Metal—The materials used for the metallic packages are usually Alloy 42, nickel, iron and copper.
    d. Glass—The glass of packages used will typically be Pb silicates. The glass is insoluble in water and in organic acids but can be etched by inorganic acids.
2. Chip—The active part of each device is a silicon chip doped at atomic levels (some tens of ppb) with phosphorus, boron and arsenic. The back of the die can be raw or metallized mainly with thin layers of titanium, or gold, or nickel in order to enhance the die capacity to bond to the header or to the leadframe.
3. Metallic parts—The heat-spreaders and the lead frames of plastic packages can be composed of Alloy 42 or copper alloys. The copper alloys are a combination of copper with a small amount of alloying elements such as Ag, Co, Fe, Zn, P. Alloy 42 is an alloy of iron with 42% nickel.
4. Other—The inks (marking) used for metallic, plastic, glass or ceramic packages are most typically epoxy resins with dyes. The relevant pigments can be either inorganic (Fe, Zn) or organic dyes. However, ink marking going to be totally substituted by laser marking.

The values given for each chemical element are believed to be accurate and reliable. It is possible to extrapolate approximate values for other packages of the same family using the proportionality criteria as reported here below.

As previously stated, enhanced recycling of WEEE should be a major factor in preserving resources, in particular energy. The Electrical and Electronic Equipment Industry is in great need of an inexpensive and simple one step method or reactor which can convert the organics in WEEE to a useful chemical feedstock or feed while recovering valuable metals and simultaneously treating heavy metals. The present invention overcomes the obstacles inherent in treating WEEE by combining a comminution means and reaction means into a single reactor.

Particulate Matter 2.5 microns (PM 2.5) (Smoke and Diesel Exhaust)

Diesel engines are the most efficient power plant among all known types of internal combustion engines. However, a drawback to diesel engines is its exhaust emissions. Although smoke and diesel exhaust emissions may be referred to as aerosols and/or solid waste, the two emissions are more commonly referred to as Particulate Matter (PM). The U.S. EPA's PM standards include two different size categories, PM 2.5 and PM 10. Particles in the air that are less than 2.5 microns in diameter are considered PM 2.5, and are generated primarily by combustion processes. Particles that are less than 10 microns in diameter are considered PM 10. The EPA established the PM 2.5 standard in July of 1997 in an effort to better protect the public's health. Particles of the 2.5-micron size are a health concern because they can bypass the body's natural filtering mechanisms and penetrate deep into the respiratory system.

Diesel Particulate Matter (DPM) is the most visible diesel pollutant due to the thick plumes of black smoke that appear at the tailpipe. DPM is a complex mix of solid and liquid matter and the main constituent is solid carbon, which is generated in the cylinder as a result of incomplete combustion. Under heavy load conditions, when the air/fuel mixture is too rich, the burning of the hydrogen element of hydrocarbons (HC) predominates, resulting in an excess of the unburned carbon element.

DPM is usually divided into three basic fractions. These are dry carbon/soot particle fraction, soluble organic fraction (SOF) and sulfuric acid particle fraction. The actual composition of DPM depends upon the type of engine, its operating conditions, and the speed and load. At higher RPM and load values, adsorbed acids and SOF proportions decrease as they combust or evaporate and become gas phase components.

The soluble organic fraction is primarily comprised of hydrocarbons and sulphates that become adsorbed onto the surfaces of the carbon spherules and agglomerated carbon particles. The components of SOF are generally acids, bases, paraffins, aromatics, oxygens, transitionals and insolubles.

In its decision of Feb. 27, 2001 the U.S. Supreme Court unanimously upheld the 1997 EPA National Ambient Air Quality Standards (NAAQS) for ozone and fine particulate matter (PM2.5). The court rejected arguments by industry, led by the American Trucking Association, that EPA acted unconstitutionally in issuing the standards. The industry groups also charged the EPA with failure to consider industry's costs for compliance when issuing health standards, but the court said no such cost-benefit requirement exists under the Clean Air Act.

In addition, major diesel manufactures have entered into a consent decree with the U.S. EPA for implementing 2004 PM 2.5 regulations no later than October 2002. An immediate solution is needed by the diesel manufacturing industry in order to meet the mandate set by the EPA.

Radioactive Wastes

The U.S. Department of Energy (DOE) has estimated the total volume of DOE and commercial radioactive wastes and spent nuclear fuel through 1995 to be approximately 5.5 million cubic meters. Each year nuclear power generation facilities world-wide produce about 200,000 cubic meters of low and intermediate level waste and 10,000 cubic meters of high level waste (including spent fuel designated as waste). The disposal or final depositary for radioactive wastes is a major problem from both financial and environmental concerns.

Former nuclear weapons production sites face even more significant problems with radioactive waste management. The scale and scope of the cleanup at these sites is enormous; officials estimate that seventy-five years and $300 billion will be required to remediate cold-war nuclear weapon facilities, Radioactive waste has been stored in large underground storage tanks at the DOE's Hanford Site since 1944. Approximately 54 million gallons of waste containing approximately 240,000 metric tons of processed chemicals and 340 million cuires of radionuclides are currently being stored in 177 tanks. These caustic wastes are in the form of liquids, slurries, salt-cakes, and sludge.

The highest cost activities anticipated at the Hanford Site are the retrieval and treatment of the waste in the high-level waste tanks to produce high-level waste canisters of glass and immobilized low-level waste. This activity is now being privatized in a two-phase approach. The first phase is underway, the second-phase contracts will be let in 2006, and completion of the waste processing activities is expected in 2028. The DOE has budgeted approximately $35.7 billion (U.S. dollars) for cleaning up Hanford's Tanks At Hanford alone, it is apparent and quite obvious that an inexpensive and timely solution exist for vitrifying high-level waste to produce canisters of glass for long term storage in a depository.

From the forgoing, it is evident that there exists a need to solve the numerous and high priority problems associated with solid, liquid and gas wastes. The use of a plasma torch for solving wastes problems is considered a very high-tech solution. For a high-tech solution such as a plasma device or method to be widely accepted, it must be simple, cost-effective and available as a modular unit as opposed to applications requiring unique designs with onsite fabrication and construction. It is desirable that the portable plasma reactor have a small footprint, yet be capable of processing a variety of wastes in the form of liquids, slurries, salt-cakes, sludges, particulate matter, solids and gases at high flow-rates.

It is also preferred that the method or apparatus combine a comminuting means with an ionized gas reaction means within the same reactor in order to save energy, time and space. Ordinarily, wave energy technologies, such as plasmas, do not combine the comminution stage with the reaction stage, which reaction state is typically a combustion, incineration, reforming, cracking, pyrolysis and/or gasification stage. Likewise, it is not typical to combine the reaction stage with the separation stage.

Furthermore, combining the comminution stage, reaction stage and separation stage is completely atypical for plasma processes and apparatuses. Moreover, the utilization of plasma to generate angular momentum for kinetic energy comminution and reaction means is distinctive and unobvious from traditional kinetic energy communition such as a jet mill.

As a rule, jet mills will utilize compressed air and/or steam as the potential energy source for converting stored energy into kinetic energy by means of fluid expansion via a decrease in pressure. Likewise, the compressed air and steam are typically produced in a separate and distinct stage from the kinetic energy or jet mill stage. Usually, an air compressor or boiler is utilized to produce the kinetic energy fluid. Other applications may utilize flue gas exhaust, engine exhaust or any compressed fluid source. Thus, in typical kinetic energy mills, the only means of increasing energy to the jet mill for increasing comminution or particle flow to the jet mill is to increase the flow-rate or pressure of the kinetic energy fluid. Likewise, traditional jet mills typically do not use an incompressible fluid such as water.

The present invention meets all of the aforementioned criteria while minimizing stages. Likewise, the present invention can utilize an incompressible fluid for comminuting and reacting means by converting the liquid to a gas and then to a plasma within the kinetic energy mill.

SUMMARY OF THE INVENTION

In one aspect, the invention encompasses a chemical reactor that synergistically combines a comminution (grinding) means with a plasma generation means. The invention includes a means for applying a fluid plasma for both comminution and chemical conversion in the same reaction vessel. In another aspect, the invention encompasses a chemical reactor and separator that synergistically combines a plasma generation means with a separation means. Yet another aspect of the invention combines a comminution means with a plasma generation means with a separation means in one reaction vessel and/or process step. And in another aspect the invention encompasses angular momentum provided in part by a plasma means for comminution, reaction and separation.

In another aspect, the present invention provides an apparatus that includes a vessel, a set of radio frequency coils and two or more jets or slits. The vessel has an interior defined by a cylindrical portion disposed between a first end and a second end, an outlet in the first end that is aligned with a longitudinal axis of the cylindrical portion, at least one inlet in the first end to receive a material. The set of radio frequency coils are disposed around or within the cylindrical portion to generate a plasma within the interior. The two or more jets or slits are mounted tangentially in the cylindrical portion to direct a fluid or a gas into the interior to create angular momentum in the plasma to form a plasma vortex that circulates around the longitudinal axis and reacts with the material.

In yet another aspect, the present invention provides an apparatus that includes a vessel, a first plasma source, a second plasma source, and two or more jets or slits. The vessel has an interior defined by a cylindrical portion disposed between a first end and a second end, an outlet in the second end that is aligned with a longitudinal axis of the cylindrical portion, and an inlet in the cylindrical portion to receive a material. The first plasma source includes a plasma torch connected to the first end and aligned with the longitudinal axis of the cylindrical portion to introduce a plasma into the interior. The second plasma source includes set of radio frequency coils disposed around or within the cylindrical portion to add energy to the plasma. The two or more jets or slits are disposed within the cylindrical portion to direct a fluid or a gas into the interior to create angular momentum in the plasma to form a plasma vortex that circulates around the longitudinal axis and reacts with the material.

In yet another aspect, the present invention provides an apparatus that includes a vessel, and two or more plasma sources. The vessel has a vertical longitudinal axis, a cylindrical middle portion aligned with the vertical longitudinal axis, a top portion, a bottom portion, one or more inlets disposed in the top portion to receive a material, and an outlet aligned with the vertical longitudinal axis and disposed in either the top portion or the bottom portion. The two or more plasma sources are mounted tangentially in the cylindrical middle portion such that the plasma touches are substantially aligned with one another in a horizontal plane with respect to the vertical longitudinal axis. The plasma from the plasma sources combine together to create sufficient angular momentum to form a plasma vortex that circulates around the vertical longitudinal axis within the vessel and reacts with the material.

The present invention is described in detail below with reference to the accompanying drawings.

BRIEF DESCRIPTION OF THE DRAWINGS

The above and further advantages of the invention may be better understood by referring to the following description in conjunction with the accompanying drawings, in which.

DETAILED DESCRIPTION OF THE INVENTION

Figure 1:
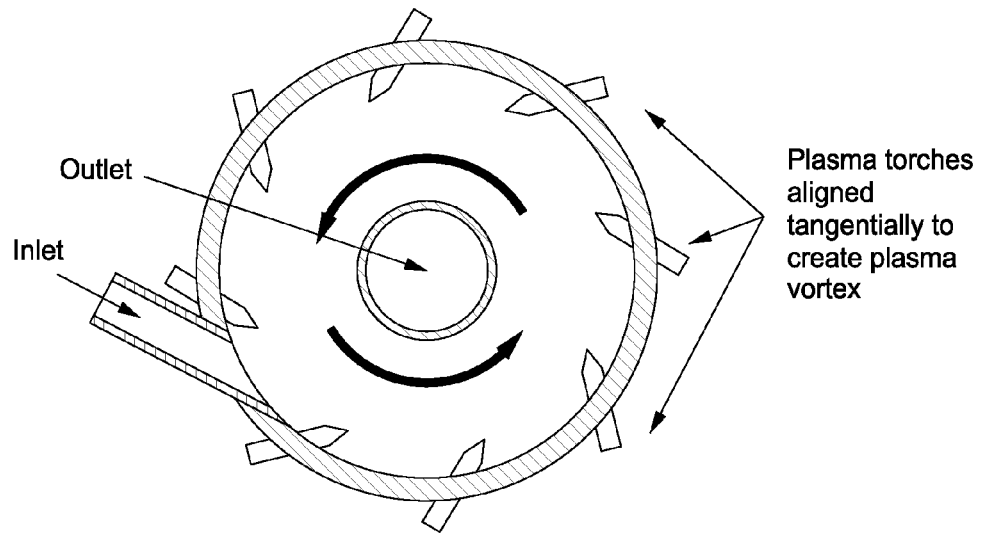
FIG. 1 is a diagrammatic, cross-sectional top view of a first embodiment Plasma Jet Vortex Mill Reactor.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

The invention encompasses methodology and apparatuses configured for forming and utilizing plasma jet for one or more of comminution, chemical reaction and separation in a single reactor system. For purposes of interpreting this disclosure and the claims that follow, a "plasma whirl comminution reactor" is defined as a reactor in which comminution and conversion of matter occurs therein. This is achieved because of the plasma's kinetic energy traveling at a high velocity in a vortex as well as the characteristics associated with a plasma (high temperature, radicals, free electrons, ions, etc). The high velocity plasma jet used in the present invention simultaneously subjects material to comminution and chemical reaction or conversion. The term "comminution" as used herein can be considered to be generic to all the terms ordinarily applied to the subject matter of the present invention such as grinding, crushing, grating, granulating, milling, disintegration, attrition, trituration, pulverization, etc. In its broadest meaning, the term comminution, as used herein, will also mean atomization. The terms vortex, cyclone, tornado, whirlpool, whirl, swirl, etc. are used interchangeably herein. These terms refer to a mass of fluid with a whirling or circular motion that tends to form a cavity or vacuum in the center of the circle and to draw toward this cavity or vacuum bodies subject to its action. In other words, the term "whirl, vortex, tornado or cyclone" as used in the present invention applies to a region within a body of fluid in which the fluid elements have an angular velocity or angular momentum. The term "chemical conversion" as defined herein includes the terms cracking, reforming, gasification, combustion, oxidation, reduction, etc. Simply put a chemical conversion with respect to the present invention means a "chemical reaction." As defined herein, plasmas are ionized gases which can be formed from DC plasma torches, microwave plasma torches, inductively coupled plasma torches, AC plasma torches, electron beams or any other means which will generate an ionized gas. In its broadest meaning, the plasma may be generated from any wave energy apparatus or method capable of producing an ionized gas. Matter as defined herein refers to the four states of matter: solids, liquids, gases and/or plasmas.

In preferred aspects of the present invention a plasma whirl kinetic energy comminution reactor utilizes a high velocity plasma jet fluid to create a plasma whirl for comminuting matter while chemically reacting the matter. Particular aspects of the present invention are described with reference to FIGS. 1-12.

Likewise, when operated in another mode, the plasma jet vortex mill reactor utilizes a high velocity plasma jet fluid to create a plasma vortex for chemically reacting matter and separating the products of the reaction of the matter. Particular aspects of the present invention are described with reference to FIGS. 1-12.

FIG. 1 hereof is representation of a Plasma Jet Vortex Mill Reactor. Plasma torches are aligned tangentially to create angular momentum that forms a plasma vortex. Solid matter, for example Municipal Solid Waste (MSW), drill cuttings, red mud, coal fines, petroleum coke, WEEE, etc, is conveyed into an inlet for simultaneous comminution and reaction. The chemical reaction of the solid matter may be based upon several variables such as, the solid matter's chemical composition, the fluid used in the plasma torches, the temperature of the reactor and the flow rates of the solid matter and the fluid. For example, if water or steam is used as the fluid in the plasma torch and the solid waste is coal, the end reaction maybe ash, hydrogen and carbon monoxide, hydrogen sulfide, chlorine and other contaminants. However, if carbon dioxide is used as the plasma torch fluid and the solid waste is carbon or coke, the end reaction may be ash and carbon monoxide. The carbon monoxide may be reformed with steam in the water gas shift reaction to produce hydrogen and carbon dioxide or may be used or sold as a chemical feedstock. The products of the reaction are flowed to an outlet for further treatment such as in a scrubber, amine unit for removing $CO_2$ or for direct use. If $CO_2$ is captured in an amine unit the $CO_2$ can be recycled back into the plasma torch.

It will be understood that the present invention can utilize a typical cyclone separator as the shell or reactor vessel. In this embodiment of the present invention, the Plasma Jet Vortex Mill Reactor, also allows for separation of the ash or solid particulate matter from the gases (hydrogen, carbon monoxide, carbon dioxide). This occurs in one stage or vessel.

The present invention comprises a novel method for comminuting and chemically converting a solid carbon source into a chemical feedstock or fuel in one reaction vessel. Additionally, the present invention also provides a novel method for comminuting, reacting or converting, and separating a solid carbon source into a chemical feedstock or fuel and ash byproduct in one reaction vessel. Pretreatment of the coke, coal or carbon sources is not necessary. Dewatering is not necessary if the reactor is operated in a steam-reforming mode.

The present invention can advantageously used as a skid or trailer mounted modular plasma reactor, having a relatively small footprint yet it can effectively comminute, react and separate a very large volume of material at extremely high flow-rates. For example, again referring to FIG. 1, by installing a plurality of plasmas torches (eight (8) will be used in this example), such as Westinghouse Plasma Corporation's MARC-II plasma torch, which are aligned tangentially, then the Plasma Jet Vortex Mill Reactor may be capable of treating extremely large volumes of waste. It will be understood that more or less than 8 torches can be used to obtain the desired comminution and chemical reaction or conversion.

The treatment rate calculated for using eight (8) Westinghouse Plasma Corporation's Torches in the present invention for MSW and ASR can range from 230 to 5,760 tons per day. These figures are based upon the nominal power of 300 kW-3,000 kW for the MARC-II plasma torch in addition to the tests conducted for gasification of MSW and ASR. For MSW and ASR, the plasma torch power ranges from 100 kW to 250 kW per ton/hour.

The novel plasma jet vortex mill reactor of the present invention provides a viable solution for handling solid waste matter problems. For example, large volumes of solid waste matter are produced in oil & gas exploration, petroleum refineries, coal burning power plants, alumina plants, landfills, automobile shredding facilities, pulp and paper mills, and sugar mills. The waste matter from these facilities vary in particle size and chemical composition. Examples of the waste matter are drill cuttings, petroleum coke, coal fines/unburned carbon on fly ash, red mud, MSW, ASR, wood chips/bark, and bagasse.

Petroleum Coke, Coal Fines and Unburned Carbon on Fly Ash

Normally, petroleum refineries have at least two delayed cokers for cracking the resid to coke and light ends. This allows cutting of the coke in the filled coke drum while the other coke drum is in operation. This process flow design allows for continuous operation of the refinery. In the present invention, the cut petroleum coke can be conveyed directly to the Plasma Jet Vortex Mill Reactor without having to be stockpiled or stored. Additionally, the Plasma Whirl Comminution Reactor can be operated with steam to produce syngas for use in the refinery.

Figure 2:
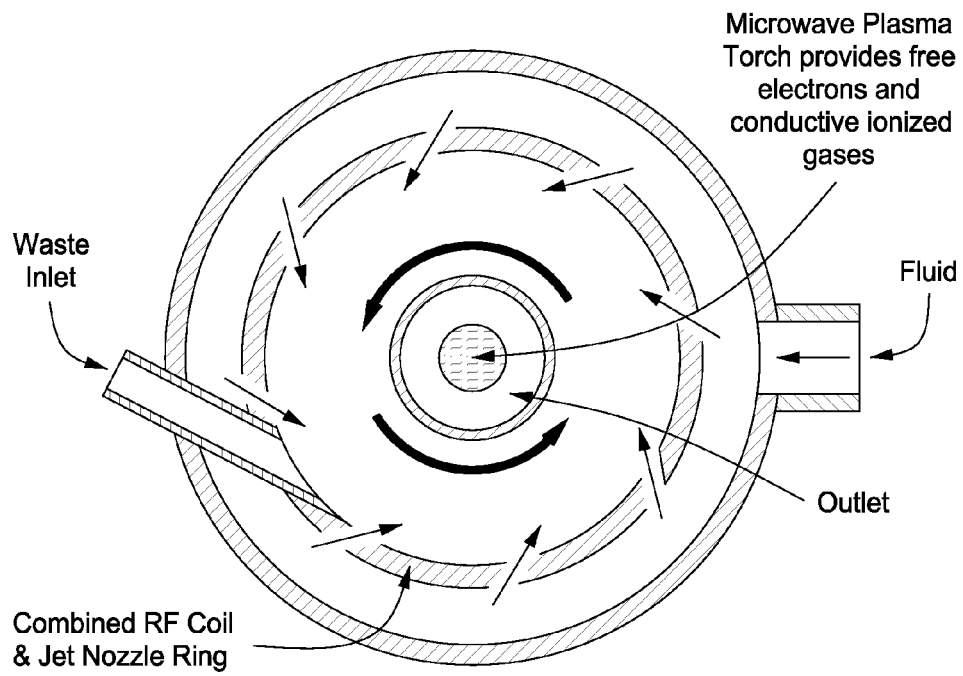
FIG. 2 is a diagrammatic, cross-sectional top view of a second embodiment Hyper Plasma Jet Vortex Mill Reactor.

Turning now to FIG. 2—Hyper Plasma Jet Vortex Mill Reactor, the Plasma Torch, such as a Microwave Driven Plasma Torch, provides free electrons and conductive ionized gases to the reactor. Microwave Driven Plasma Torches (MIDJet®) are available from Physical Sciences, Inc. (PSI) of Andover, Mass. PSI's MIDJet® is a microwave plasma torch that has no electrodes to wear out. A comminution fluid is conveyed into and enters the reactor via a combined radio frequency (RF) Coil and jet nozzle ring. Although shown as a combined unit, it will be understood that the RF Coil may be separate from the jet nozzle ring. The jets are arranged tangentially or in a means so as to initially start and preferably maintain a vortex. This elongates and constricts the plasma from the MIDJet®. When an AC current is applied to the RF Coils the microwave plasma volume increases dramatically. The rapid expansion of the plasma volume increases velocity. Thus, the initial angular velocity is dramatically increased which immensely increases angular momentum within the reactor.

This imparts a novel, unobvious and very unique method for comminution, chemical reactions and separation. Since it is well known and well understood that plasma jets can obtain velocities greater than 3,000 meters/second with high energy densities, then the plasma jet can be converted to angular momentum and energy. Not being bound by theory, it is believed that as the RF coils increase the plasma volume the velocity will increase dramatically without an increase in fluid flow. It is also believed that by centrally locating a plasma source (microwave plasma torch), the centrally located plasma region will remain in an extremely highly activated state. This is so for several reasons. First, the vortex creates a central void or vacuum. Second, since in a vacuum the molecules will be farther apart, thus less collisions will occur. An electron beam can be used for creating the central ionized gas region in lieu of a microwave driven plasma torch. An ideal electron beam source for the present invention is a non-vacuum electron beam welder.

The highly activated ionized gas center allows for complete dissociation of all matter entering into it. The molecules, atoms or radicals with a mass low enough to enter into the central vacuum or "eye of the tornado" may be fully dissociated if a sufficient amount of energy is applied to the Hyper Plasma Jet Vortex Mill Reactor. Likewise, large and more dense particulate matter will be flung toward the outside of the vortex.

In kinetic energy comminutation devices, such as a jet mill or fluid energy mill, a gas is used in combination with angular momentum to disintegrate particles into smaller particles. A jet mill uses stored potential energy to create angular momentum. Potential energy is stored within a compressed gas such as compressed air or steam. However, the compression stage occurs in a separate and distinct process/apparatus such as a boiler or compressor. It is well known that air compression is an inefficient means for storing energy. The jet mill is utilized for particle comminutation, disintegration or grinding.

Another device that takes advantage of angular momentum is a cyclone separator. Both the jet mill and cyclone separator are utilized for comminutation, drying and separating but not as a chemical reactor.

On the other hand, the present invention imparts angular momentum to particles within the reactor by means of increasing the plasma volume. In comparison, this would be akin to increasing fuel flow into a combustion turbine or any internal combustion engine. However, in contrast, the present invention's energy source is stored and transferred into the reactor via electrons and photons or quite simply wave energy. It is the wave energy that is the means for imparting a sufficient amount of angular momentum to the reactor and not simply just the gas flowing into the reactor.

In part, the novelty of the present invention leads to unexpected results due to the combined effects of a jet mill with that of a plasma torch. It is unexpected that a plasma torch in combination with another plasma generation device, coupled to impart angular momentum in a vessel, allows for a reduction in the flow rate of the jet fluid. This unexpected combination can be explained as follows:

1. An initial wave energy generating means provides wave energy to the reactor.
2. At least one other wave energy generating means is used to increase angular momentum within the reactor.
3. As the second wave energy generating means is energized the ionized gases increase in temperature.
4. Due to the increase in temperature, the gases expand rapidly.
5. The increase in gas volume increases velocity.
6. Due to the design of the reactor, the plasma velocity is transferred into angular momentum. Thus, angular momentum is increased within the vessel by not having to increase gas flowrate or solid flowrate to the reactor.

In essence, waste or fluid flowrate to the vessel can be stopped or recycled using valves or any other suitable means and the reactor can be operated similar to a giant light bulb or continuous recycling reactor. This "giant light bulb" mode of operation would be a closed loop operation.

Another unexpected result of the present invention is the ease of controlling the reactor via electronics. This is contrasted to the difficulties in controlling modern day jet mills, pyrolysis, gasification, reforming and cracking reactors, and cyclone separators via fluid flow. The speed at which the present invention can be controlled is the speed of wave energy. By utilizing solid-state power supplies and microwaves the speed of electrons and the speed of microwave photons (speed of light in an atmosphere) are used. Current modern day practices utilize valves that may be electronically controlled and actuated, but the sealing or throttling device operates mechanically. This will best be explained in a gas flaring example.

Flaring waste gases is common in many industries. Flares may operate intermediately, all the time, automatically or with operator assistance. However, the flare ignition device, normally a pilot light, may operate continuously. This is similar to the pilot light on a gas stove or oven. The pilot light stays on all the time. When the gas valve for a burner on the stove is turned to the low, medium or high position, gas flows through the burners and is ignited by the pilot light.

In the present invention, as shown in FIG. 2, the MIDJet® (microwave plasma torch) or the wave energy source, acts similar to a pilot light. The gas or fluid for the plasma torch can be steam, VOCs, $CO_2$, air, oxygen, hydrogen, nitrogen or any other fluid capable of being ionized and forming a plasma. If the wave energy source is an electron beam then a fluid is not necessary. Simply a stream of electrons acts as the pilot light. In the event of a plant upset, when VOCs or any other fluid is flowed to the reactor, the RF field is energized or more energy is applied to the RF Coil. The reactor can be designed to operate similarly to an electric motor in which as the load or torque increases on the motor's shaft more electricity is flowed through the windings to increase torque. It will be understood that many variations and automated control schemes can be utilized to automate the reactor. Some of the parameters that can be monitored to automate the reactor are temperature, flow-rate, valve position, amps, volts, etc.

Fire Tornado and Plasma Whirl

Figure 3:
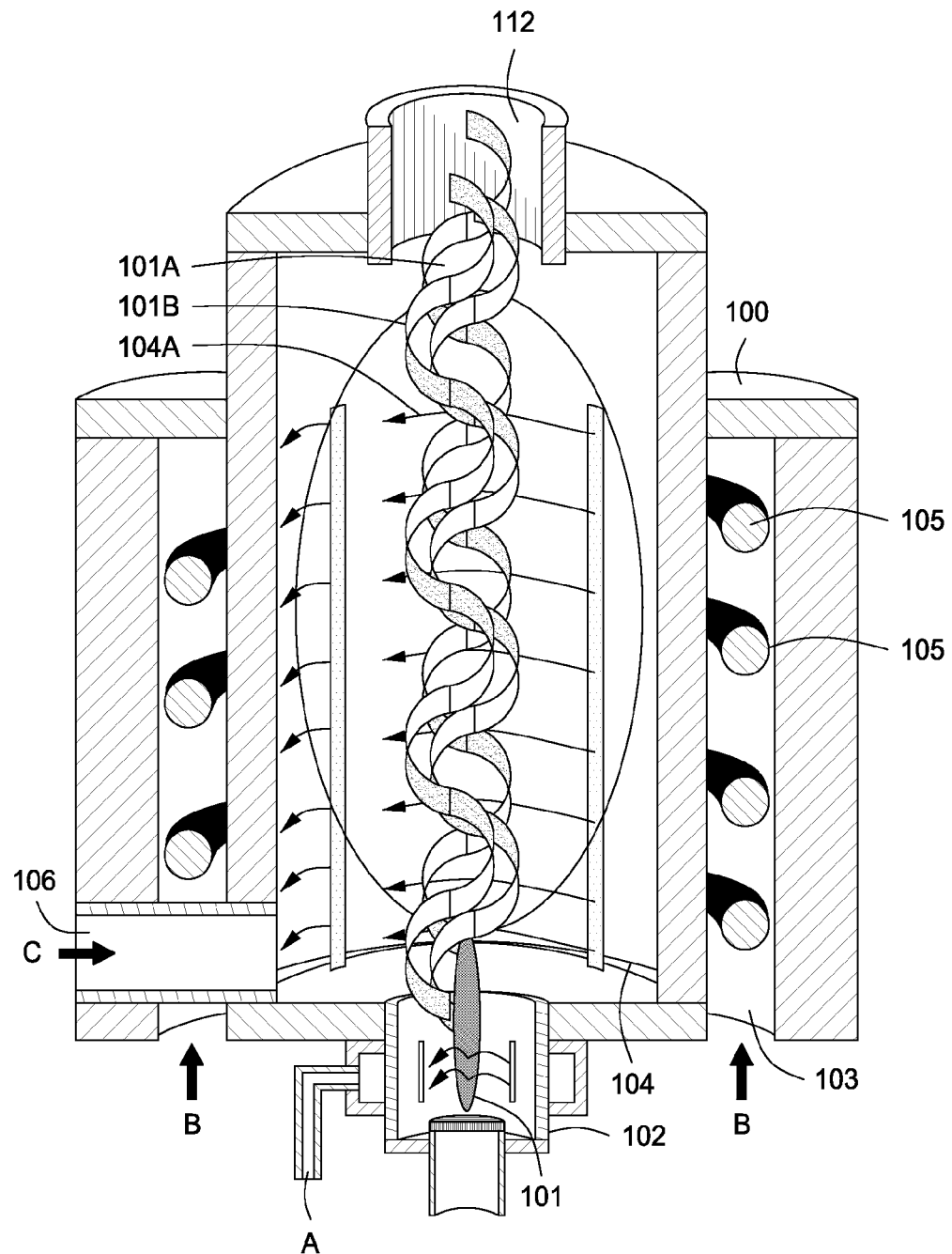
FIG. 3 is a diagrammatic, cross-sectional side view of a third embodiment Plasma Whirl Reactor.

FIG. 3 hereof is a representation of a Plasma Whirl Reactor of the present invention. FIG. 3 illustrates the whirls that will be present in such a reactor and helps one with understanding the advantages of the present invention's plasma whirl reactor over conventional plasma systems. In comparison and contrast to a plasma whirl and to better understand "whirl" flow, an explanation of fire whirls can be found in the following publications from the U.S. Dept. of Commerce Technology Administration, National Institute of Standards and Technology (NIST):

1. NISTIR 6341 "Simulating Fire Whirls";
2. NISTIR 6427 "The Fluid Dynamics of Whirls—An Inviscid Model"; and
3. US Today Newspaper, Jun. 24, 2002 issue.

In order to demonstrate the wide variety of uses for the present invention, some of the figures hereof will be described in various preferred applications. For example, flares and solids found in the Oil & Gas Industry and biogas and MSW found at landfills. However, it will be understood that the present invention can be applied to many different applications in various industries. In addition, the present invention will be demonstrated in both cracking and reforming modes. Likewise, the present invention will be demonstrated in a carbon sequestration mode, which in turn allows for the production of a relatively clean hydrogen stream.

Flare

Figure 3A:
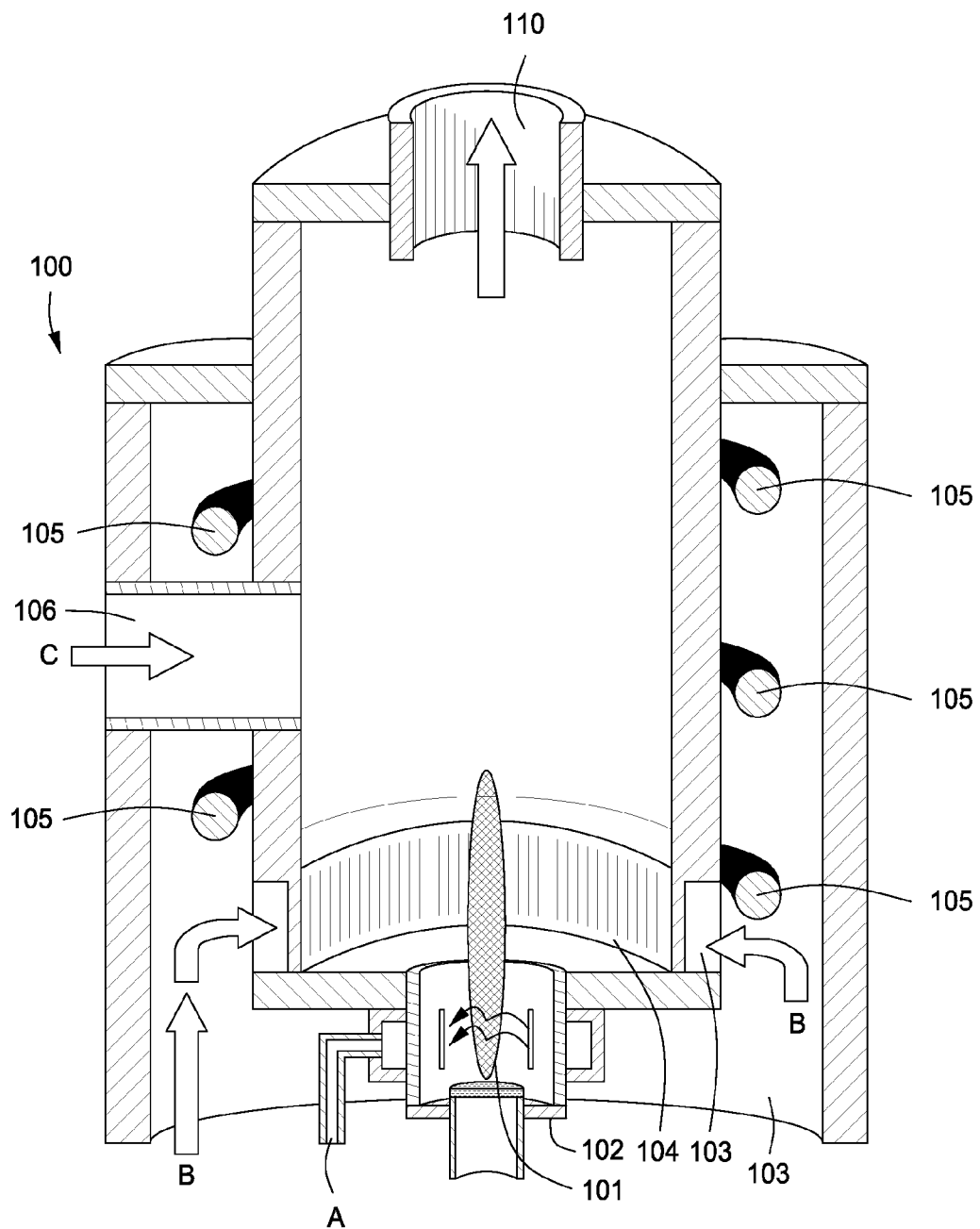
FIGS. 3A, 3B and 3C are diagrammatic, cross-sectional side views of an embodiment Plasma Whirl Reactor illustrating the sequence for forming a Plasma Whirl.
Figure 3B:
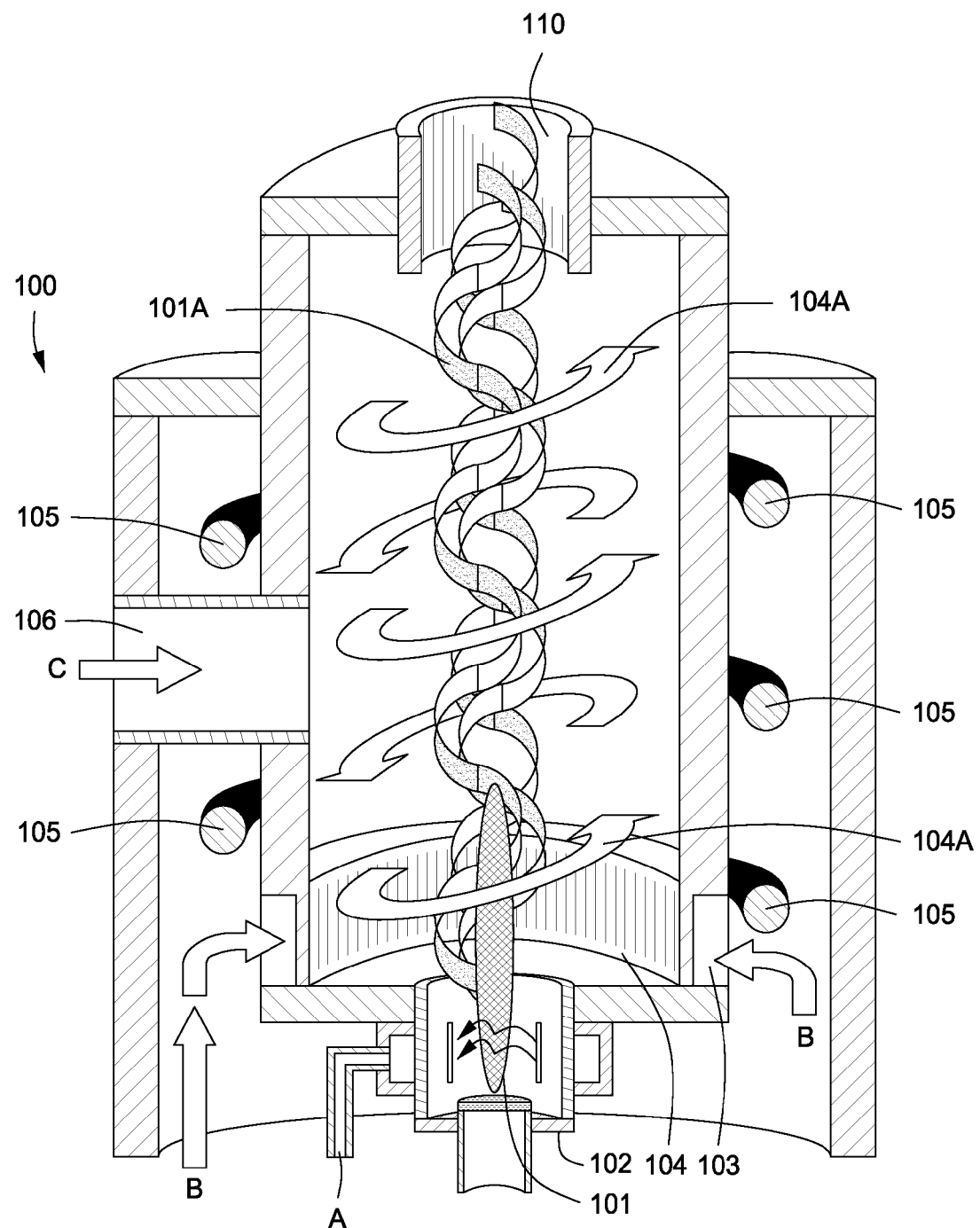
Figure 3C:
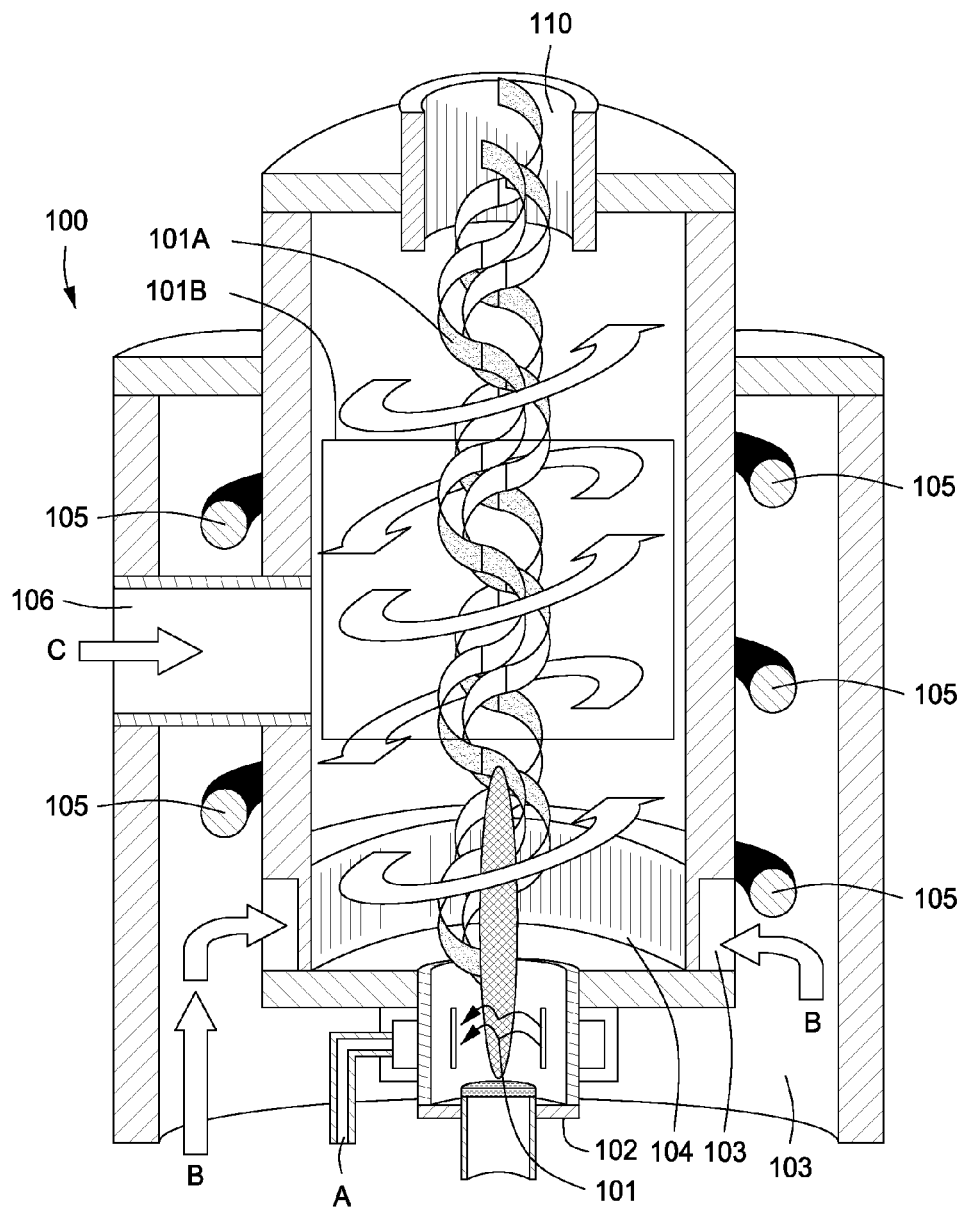

Turning again to FIG. 3 hereof and also to FIGS. 3A-3C there is illustrated a Plasma Whirl Reactor 100 that is comprised of a pilot plasma 101, the pilot plasma elongated, constricted and whirled 101A along the longitudinal axis and the plasma volume increased radially 101B. A first wave energy source 102 generates the pilot plasma 101 and the second plasma 101B is generated by a second wave energy generation means 105, such as a Radio Frequency (RF) induction coil.

A fluid B, such as flare gas, enters reactor 100 through inlet 103. The flare gas or fluid B then flows through a serious of jets or slits 104 which are coupled to the reactor in a way to impart angular momentum 104A to pilot plasma 101. RF coils 105 may be energized before, during or after the entry of the flare gas or fluid B into the reactor 100.

Next, several unsuspected but highly desirable results can occur. For example, angular momentum or the velocity of the whirl 104A is increased due to adding potential energy in the form of electromagnetic radiation energy (photons or electrons) via the RF coils 105. Thus, fluid B flow does not need to be increased to increase angular momentum 104A as is common with jet energy mills. Also, the plasma volume increases dramatically due to forming the second plasma 101B. However, the angular momentum and/or whirl 104A effects the pilot plasma 101A by constricting it radially while increasing its length along the longitudinal axis of the reactor 100. This sequence of events is demonstrated in FIGS. 3A, 3B and 3C hereof.

In FIG. 3A—in lieu of using slits or jets, a squirrel cage fan 104 is utilized for imparting angular momentum or whirl 104A to reactor 100. Squirrel cage fan 104 is fixed in place (does not rotate) by any known attachment means, such as bolting, rivoting, welding, gluing, clamping, etc. Reactor 100 may be fabricated such that the squirrel cage fan 104 is an integral part of reactor 100. This can be accomplished by machining, or molding, squirrel cage fan 104 as a part of reactor 100.

Fluid B flows into inlet 103, which in this case is the annulus between the reactor wall and a refractory/EMR permeable wall 100A. Squirrel cage fan 104 in the present invention operates opposite that of a typical blower that incorporates a squirrel cage fan. The purpose of the squirrel cage fan, jets, slits, nozzles or louvers 104 is to impart initial angular momentum 104A within reaction chamber 100B.

In FIG. 3B—when the flare gas or fluid B flows through squirrel cage fan 104 angular momentum 104A is created and imparts a desirable quality to the pilot plasma 101. Due to the angular momentum and whirl 104A pilot plasma 101 is now stretched and constricted into an elongated whirl plasma 101A along the longitudinal axis of reactor 100.

In FIG. 3C, when RF coils 105 are energized the plasma volume increases radially to form a very large plasma 101B. Once again the unexpected but extremely desirable quality of an increase in angular momentum is imparted to reactor 100. This additional attribute performs several functions with unexpected results. Again referring to FIG. 3C a second fluent material C enters the reactor via inlet 106. Due to angular momentum and whirl 104A in combination with centrifugal force the fluent material is comminuted by particle to particle collisions, heat and the high velocity plasma. In addition, the secondary large plasma 101B provides heat, wave energy, radicals and ions for chemically reacting reactants into products.

Not being bound by theory, it is also believed that the Plasma Whirl Reactor of the present invention can be used to separate materials as well as to increase residence time within the reactor 100 for particulate matter. Dense particulate matter is separated from less dense matter, such as light gases (hydrogen) due to angular momentum 104A which forms centrifugal force within the reactor 100. The less dense matter may be entrained within the elongated pilot plasma 101A. The dense matter is entrained within the peripheral of the large plasma 101B. The reactor can be designed such that the all matter exiting the reactor must pass through the elongated pilot plasma 101A.

Another unexpected but desirable result occurs when outlet E and reactor 100 are modified in size and shape to resemble a cone, cyclone separator or jet mill. By referring to FIGS. 1, 2, 4, 5, 6, 6A, 7, and 7A the reactor may be constructed similar to a cyclone separator and/or a jet energy mill. This attribute performs several functions with unexpected results.

It should be noted that the terms "matter" and "particulate matter" as used herein refers to particles, ions, atoms, molecules and elements in solid, liquid, gas or plasma states. Once again, not being bound by theory, it is believed that more dense matter will remain in the outer portion of the whirl, while less dense matter will remain within the central vortex of the plasma whirl. Thus, matter of different densities can be separated from the main flow via the vortex by designing the reactor similar to a cyclone separator.

The plasma whirl reactor of the present invention can easily replace a flare to achieve zero emissions, discharges or releases. For example, during upsets in a refinery or petrochemical plant an operator may send a feedstock stream, such as methane to a flare. However, if the present inventions plasma whirl reactor were in place, the operator would have an alternative to flaring and releasing emissions to the atmosphere.

The Plasma Whirl Reactor of the present invention can easily be configured for intermittent operations such as replacing a flare. First, pilot plasma source 102 can be an extremely low powered source. One example is a 6 kW MID-Jet®. Another example is a lower powered non-transferred arc plasma cutting torch. The plasma carrier gas may be selected from steam, $CO_2$, air, oxygen, nitrogen, hydrogen, helium, VOCs or any other gas capable of being ionized. For the sake of simplicity since many flares are steam assisted, then steam will be used in the following example.

Cracking

The Plasma Whirl Reactor of the present invention may be operated in a cracking mode, by increasing or turning on power to RF coils 105. Since pilot plasma 101 is already formed, by energizing coils 105, this will form the large plasma volume 101B. As soon as the feedstock from the plant upset flows into inlet 103 and through jets 104, several processes occur simultaneously. First, angular momentum increases. This forms the elongated pilot plasma 101A. Second, the hydrocarbon (HC) feedstock, such as methane or an ethane/propane mix, commonly used for ethylene production, is cracked into hydrogen and carbon provided that the feedstock flow B is far greater than the steam flow A into pilot plasma torch 102 which produces the pilot plasma 101. It will be understood that pilot plasma 101 may utilize the HC as carrier gas A in lieu of steam.

Figure 6:
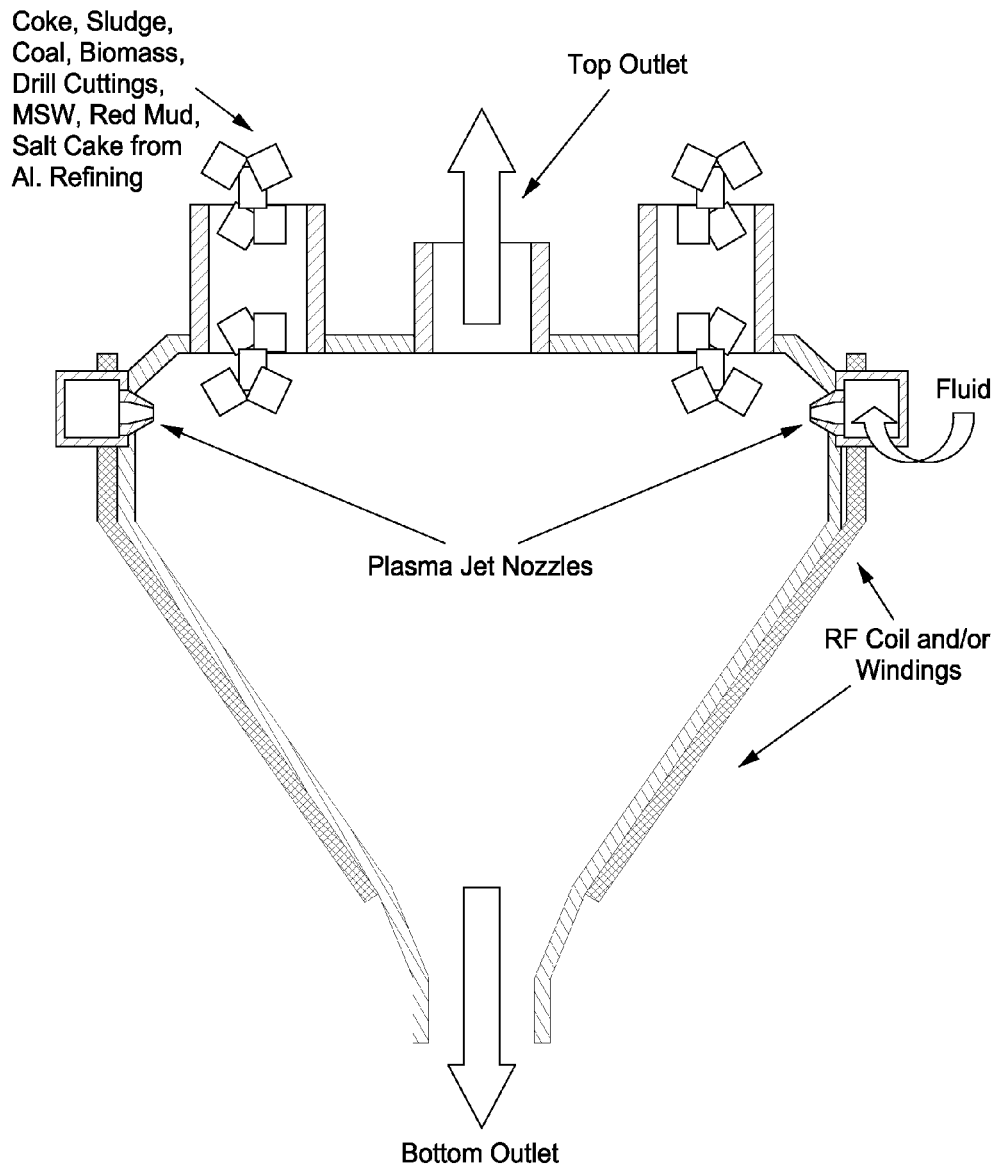
FIG. 6 is a diagrammatic, cross-sectional side view of a sixth embodiment Hyper Plasma Jet Cyclone Separator Reactor.
Figure 6A:
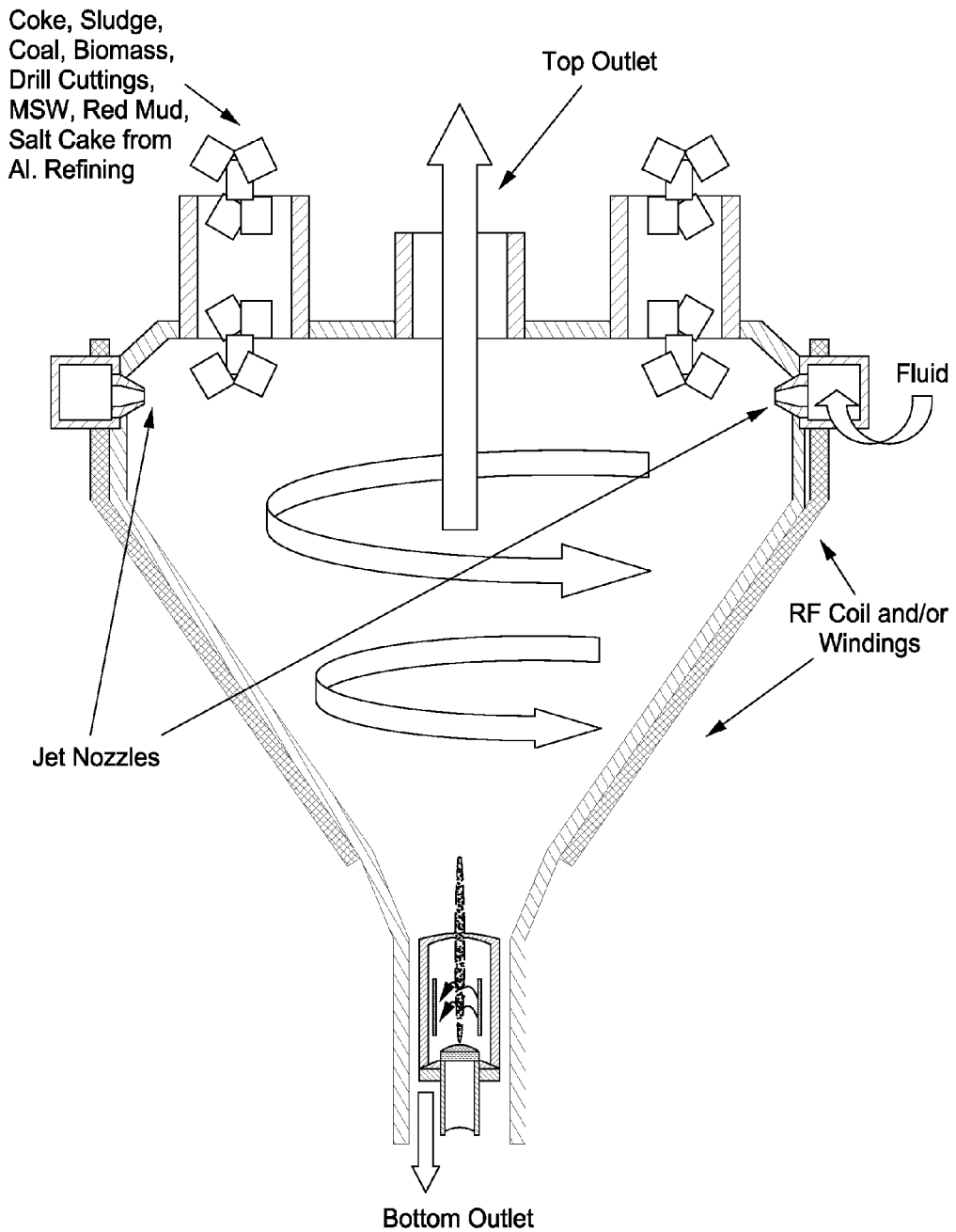
FIG. 6A is a diagrammatic, cross-sectional side view of another embodiment Hyper Plasma Jet Cyclone Separator Reactor.

It is believed that the cracked products, hydrogen and carbon can easily be separated from each other, by designing the Plasma Whirl Reactor similar to that represented in FIG. 6A hereof. The lighter hydrogen will remain in the central vortex while the carbon will be forced to the outside of the whirl. The hydrogen can exit the reactor via a top outlet while the carbon exits via a bottom outlet. It will be understood that a pilot electron beam can be used in lieu of the pilot plasma torch. Thus, this would eliminate carrier gas A.

Reforming

The Plasma Whirl Reactor of the present invention can be immediately switched to a $CO_2$ reformer for the production of syngas. Referring back to FIG. 3 hereof, if the plant desires to produce syngas in lieu of hydrogen and carbon, the operator can flow $CO_2$ into reactor 100 via inlet 103. It will be understood that the $CO_2$ can be premixed with feedstock stream B, prior to entry into reactor 100. A plant that has a large $CO_2$ point source emission such as an ethylene oxide plant can utilize the $CO_2$ in the present invention for production of syngas. The syngas can then be transferred via pipeline to a nearby refinery of chemical plant for use as a chemical feedstock. The use of the present invention in this application eliminates the $CO_2$ emission at an ethylene oxide plant.

If the Plasma Whirl Reactor is operated at a temperature greater than 1000° C., the $CO_2$ reforming reaction is exothermic. Thus, any refinery or industry in dire need of hydrogen can utilize any HC stream to efficiently produce hydrogen with the present invention's Plasma Whirl Reactor.

As previously stated, the Plasma Whirl Reactor of the present invention can be configured in accordance with FIGS. 1 through 7A hereof or in any manner that will provide a source for an ionized gas that provides a means for angular momentum. The product from the chemical reaction of the reactants in the Plasma Whirl Reactor of the present invention can be further scrubbed or purified in accordance with FIG. 8 hereof Referring to FIG. 8 hereof, the syngas produced from plasma whirl reactor 100 is conveyed into eductor 200 by means of suction provided by a quenching fluid that flows into a quench/scrubbing tower 300. The quenching/scrubbing fluid may be selected from the group consisting of water, amines, emulsions, hydrocarbons, organic fluids, caustic soda, calcium oxide, red mud, and any fluid that will quench and scrub the syngas. Pressurized fluid is provided to eductor 200 by means of a pump or compressor 400 via pipe 401.

Upstream Petroleum Processes—Drill Cuttings, Flare, Diesel Exhaust and Degasser

The novelty, usefulness, and unobviousness of the present invention will be demonstrated in another example. Drill cuttings are the soil that is removed when a hole is bored into the ground during oil & gas well drilling operations. Currently, the drill cuttings are separated from the drilling mud with a shale shaker or other means known in the industry. Likewise, entrained gases within the drilling mud are separated from the solution with a degasser. These, two emission sources must be handled in a safe and environmentally sound manner. Most drill cuttings end up being pumped down an injection well. Gases from the degasser are usually flared. Drilling rigs normally use diesel engines and diesel generators. Diesel exhaust is another release that is regulated and must be dealt with. Another release, or waste, is the sludge produced from the Dissolved Air Floatation (OAF) unit. Currently, the solid wastes in particularly the drill cuttings are stored on the rig in cutting boxes. Cutting boxes take up valuable space and are also an additional leased expense. The cuttings are conveyed to a supply boat for transportation to a shore facility. At the dock, a crew will add water to the cuttings in order to pump it out of the storage tank. Next, the crew washes out the tank. The drill cutting solution is taken to an injection well facility for final disposal into a geological formation.

The present invention eliminates the problems associated with drill cuttings. The present invention provides a solution onsite at the shale shaker. Thus, the present invention solves a current concern that was addressed at the Offshore Technology Conference held in Houston, Tex. during the week of April 30 to May 3, 2001.

Figure 5:
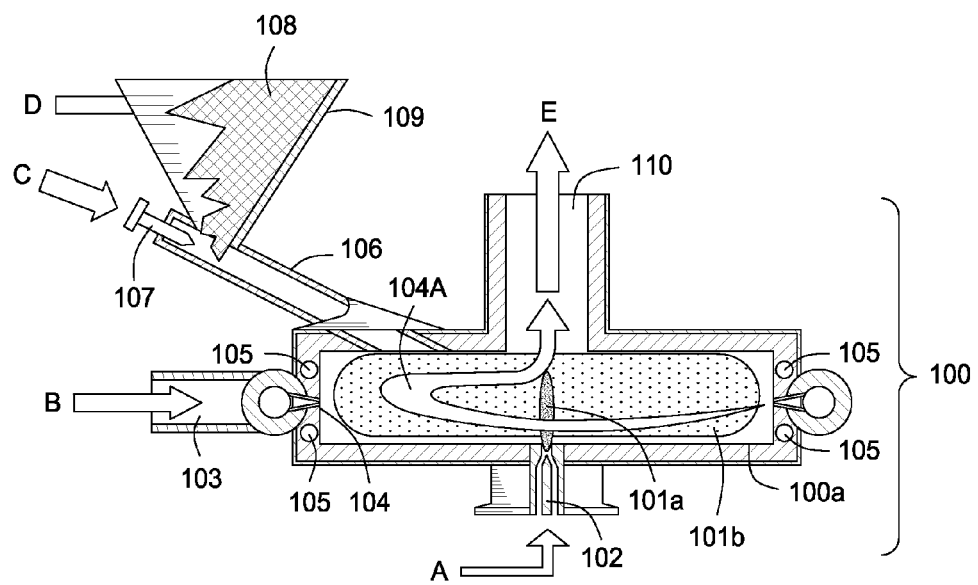
FIG. 5 is a diagrammatic, cross-sectional side view of a fifth embodiment Plasma Fluid Energy Mill Reactor.
Figure 10:
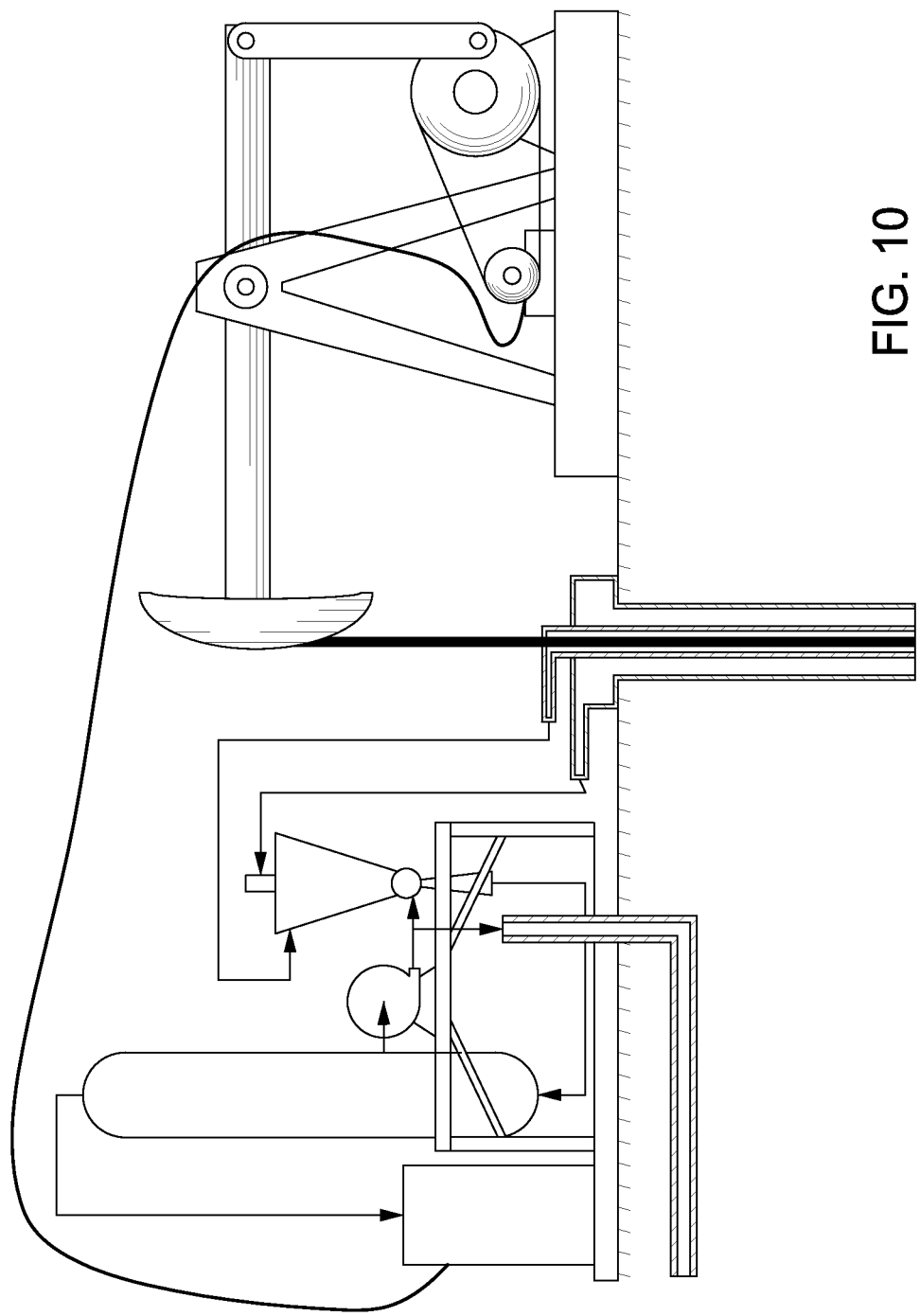
FIG. 10 is an illustration of an embodiment for Onsite Rig/Pad Flare Elimination, Diesel Emissions Treatment and Drill Cuttings Conversion to Fly ash with a Plasma Whirl Reactor.

The present invention solves both the flare and drill cutting problems common in modern day oil and gas drilling operations. FIG. 5 hereof is a representation of a Plasma Fluid energy Mill Reactor of the present invention. Reactor 100 is located near the shale shaker as shown in FIG. 10 hereof in order for cuttings to be fed directly into hopper feed system 107 as shown in this FIG. 5. It will be understood that any type of feed system can be used to convey the cuttings into the reactor 100.

Once again, the Plasma Whirl Reactor of the present invention may be operated in an intermittent or continuous mode on a drilling rig. Referring to FIG. 5 hereof, pilot plasma 101A, or wave energy, is generated with plasma source 102 or electron beam. Any gas on the drilling rig may be used as carrier gas A for plasma source 102. Steam produced by recovering heat from the reactor 100 will be used as the carrier gas A for the pilot plasma in the following example.

Referring to both FIGS. 5 and 10 hereof, diesel exhaust B from the diesel generators or diesel pumps is conveyed into reactor 100 and flowed into jets 104 which are fluidly coupled to inlet 103. RF coils 105 are energized to increase the plasma volume, temperature and angular momentum. At this point, diesel exhaust emissions B are also being treated for nitrogen oxide contaminants. It will be understood that steam or any other fluid may be flowed into inlet 103 in lieu of diesel or gas turbine exhaust.

When the degasser removes gases entrained within the drilling mud and cuttings without any operator input, the degasser gas C flows to inlet 107 instead of to a flare. Inlet 107 may be a venturi jet nozzle. As drill cuttings 108 fill hopper 109, the cuttings 108 are removed from the hopper via a venturi eductor or inlet 106 that conveys the motive gas C and cuttings 108 into the reactor. Steam or an inert gas D may be used to provide a gas blanket on the drill cuttings within hopper 109. The hopper 109 is not necessary if another storage and conveyance means are available on the oil rig.

Once again, the reactor can be operated in a cracking or reforming mode based on the nature of fluid B. It will be understood that reactor 100 may be constructed in a flat pancake style fluid energy mill such as FIGS. 4 and 5 hereof, or shaped similar to a cyclone separator such as in FIGS. 6, 6A, 7, 7A and 8 hereof The cuttings will be comminuted, dried and converted into fly ash upon entry into reactor 100. Organics, such as diesel, drilling fluids, etc. will be cracked or reformed to hydrogen, carbon monoxide, hydrogen sulfide and nitrogen. Likewise, diesel exhaust may be reformed provided enough organics are present within reactor 100. The water vapor and carbon dioxide present in the diesel exhaust will provide the source of oxygen to form syngas. The syngas can then be used on the rig as a fuel or piped and sent to downstream production facilities. Thus, the present invention has provided a novel method for eliminating flares on drilling rigs while simultaneously converting drill cuttings to fly ash while also treating the rig's diesel exhaust emissions.

FIG. 6A hereof represents another mode of operation of the present invention that can be utilized to produce a substantially pure stream of hydrogen using only one reactor. A carbon source is combined with calcium oxide and fed into the reactor. The fluid entering into the jet nozzles that will provide the initial angular momentum is steam. Likewise, steam is used as the carrier gas for the pilot plasma torch. Process efficiency can be enhanced by slaking the lime with water that is entrained within the drill cuttings. This will add energy in the form of heat to the reactor from the combination of Calcium Oxide with water.

Three processes are now synergistically combined within a single vessel of the present invention:
1. the reactor comminutes the carbon matter and calcium oxide;
2. the plasma dissociates and reforms the steam into hydrogen and atomic oxygen;
3. the calcium oxide reacts with carbon and atomic oxygen to form calcium carbonate;
4. the remaining calcium oxide reacts with other contaminants such as sulfur and chlorine to form for example solid calcium sulfate and calcium chloride respectively; and
5. the carbonate, sulfate and chloride solids exit through the bottom outlet while the pure hydrogen exits through the top outlet.

Onboard a drilling rig or land based drilling pad, the substantially pure hydrogen can be used in a fuel cell to provide electricity to the rig while obtaining zero emissions. This effectively eliminates diesel emissions. Likewise, if methane or any carbon source such as diesel or solid waste is present onboard the rig a pure hydrogen stream can be produced for use as fuel or a chemical feedstock. It will be understood that this invention can easily be practiced with coal or petroleum coke as the source of carbon. The present invention can also use raw crude oil for production of hydrogen.

Drill Cuttings located on the Ocean Floor below Rigs

The present invention can be operated in a vitrification mode for treating drill cutting piles that are located below production platforms. Since the apparatus of the present invention is relatively small, it can easily be attached to a Remotely Operated Underwater Vehicle (ROV). Electrical leads for operation of the EMR power supplies can be tethered from the rig or a ship to the Plasma Whirl Reactor and ROV. The Plasma Whirl Reactor can include a small boiler that will produce steam by means of an electric heating element. The steam can then be used for the microwave pilot plasma. Drill cuttings could be conveyed to the unit with an auger, dredge cutting head assembly or pump. The cuttings can be pumped into the reactor and allowed to melt and flow out of the reactor back into the seawater. Upon being quenched, the molten solution immediately vitrifies, thus encapsulating heavy metals.

Figure 4:
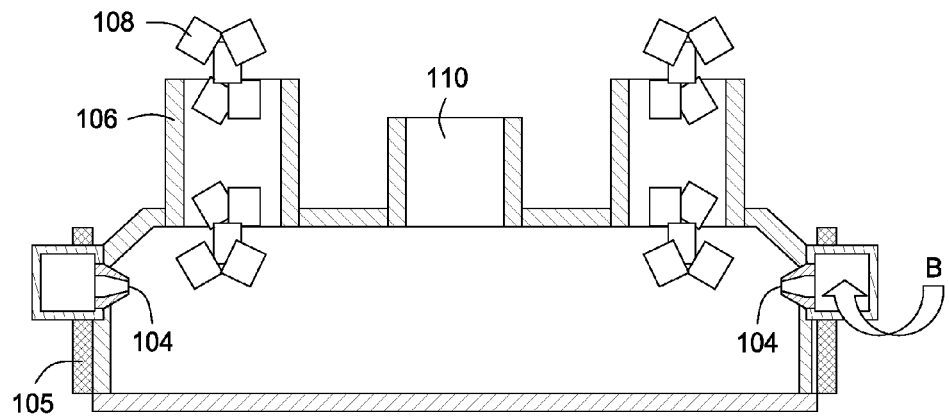
FIG. 4 is a diagrammatic, cross-sectional side view of a fourth embodiment Plasma Jet Pancake Mill Reactor.

Downstream Petroleum Processing—API Separator & DAF Sludge, Petcoke and Spent Acid API Separators and Dissolved Air Floatation Units produce oily waste and sludges. By use of the present invention, it is not necessary to further treat the oily waste or sludge. The oily waste or sludge, can be conveyed into reactor 100 as shown in FIG. 5 hereof, via hopper 109. In another mode illustrated in FIG. 6A hereof, the oily waste can be the fluid for creating the initial cyclone. Or referring to FIG. 4 hereof and comparing it to FIG. 1 hereof, plasma torches are aligned tangentially to impart angular momentum within the reactor. The sludge or oily waste can be fed into an inlet located on the side of the reactor as shown in FIG. 1 hereof in which the reactor is designed to also perform as a cyclone separator. However, the sludge or oily waste may be fed from the top as shown in FIG. 4 hereof. FIG. 4 hereof also shows an RF coil in the reactor wherein the tangentially aligned plasma torches can be enhanced dramatically. It will be understood that the RF coil can be located on the top and bottom or just on the top of the reactors shown in FIGS. 1, 2, 4, and 5 hereof. For simplicity purposes, a typical winding cylindrical shaped RF coil is illustrated in the present invention.

Oil Production and Oil Shale Upgrading

The processing and production of valuable fuels from oil shale has not been economical in most parts of the world. First, the oil shale must be mined. Next, it is crushed then fed to a pyrolysis unit in which the kerogen is released from the oil shale as shale oil. The shale oil is then upgraded to useful hydrocarbon products.

A benefit and unexpected result of practice of the present invention is that drill cuttings are finely comminuted and dried to a point wherein the fly-ash type material can be mixed as an additive into the cement that is used for cementing the well bore. Thus, most of the material from the well bore can go back into the well bore as part of the cement. The remainder can be transported to shore as a useful product, simply dumped overboard or used for weighing down pipelines by cementing the outside of the pipe.

The Plasma Comminution Reactor of the present invention solves many of the problems associated with mining and recovering valuable products from oil shale. For example, the modular and mobile Plasma Comminution Reactor can be located at the mining site. The mined oil shale is conveyed directly to the Plasma Comminution Reactor which can be operated to recover the oil from the shale, or simply to convert the oil to syngas. The solid waste produced from the reactor can b~ placed back into the mine. The syngas can be transported via pipeline to the end user. However, it will be understood that the syngas can be used onsite as a chemical feedstock or for the production of electricity.

Upgrading Crude at the Wellhead

A process that can economically upgrade crude oil at the wellhead would be valuable as well. Maya crude, which is produced in Mexico, has a relatively high sulfur content. Consequently, many refineries cannot accept the crude. Further, many refineries are not willing to undertake major capital improvements in order to process such a heavy sour crude.

In June of 2000, Pemex began conducting studies to lighten the grade in a bid to increase the number of refineries that can process Mexico's oil. The process under study involves subjecting the Maya crude—which makes up about half of Mexico's total oil reserves—to hydrogen at high temperatures and pressure in the presence of a catalyst. The reactions from this process help to eliminate sulfur and metals, lowers the overall density and increases the yield of distillates. The resulting crude is a grade somewhere between Mexico's extra light Olmeca and light Isthmus grades—both of which garner higher prices in world crude oil markets.

While the initial findings from the study are positive on the processing side, researchers are still fighting to bring down the projects' costs to make widespread application financially viable. Pemex officials have estimated that Mexico would need to fund three or four of these conversion plants, each costing between $200 and $300 million and build, in order to transform the Maya crude now slated for export.

It is evident that a need exists for upgrading sour crudes, such as Maya crude. A modular portable apparatus and process that can upgrade crude at the wellhead would minimize capital improvements in refineries. However, the first step in upgrading crude oil at the wellhead is the production of hydrogen onsite.

Upgrading crude can also include simply increasing its API gravity thus enhancing transportation as well as downstream processing. The end product is usually referred to as syncrude. For example, Phillips, Texaco and PDVSA (Venezuelean Government Owned Petroleum Company) have agreed to proceed with the Hamaca Project.

The Hamaca Project partners have committed to continue developing Phase II of the Project, which is expected to produce and upgrade 190,000 barrels per day of extra heavy crude from the Orinoco Belt, located in Venezuela. The Project contemplates the extraction of extra heavy crude of 8.5° API in the Hamaca area, which will be transported by pipeline to an upgrading plant to be constructed in the Jose area, located in northern Anzoategui. The crude will be processed using state-of-the-art technology into a high commercial value 26° API synthetic crude to be exported and sold on the international market.

Venezuela, the Orinoco Belt, Heavy Crude Oil

Venezuela is important to world energy markets because it holds proven oil reserves of 77 billion barrels, plus billions of barrels of extra-heavy oil and bitumen. Venezuela consistently ranks as one the top suppliers of U.S. oil imports and is among the top ten crude oil producers in the world.

Figure 11:
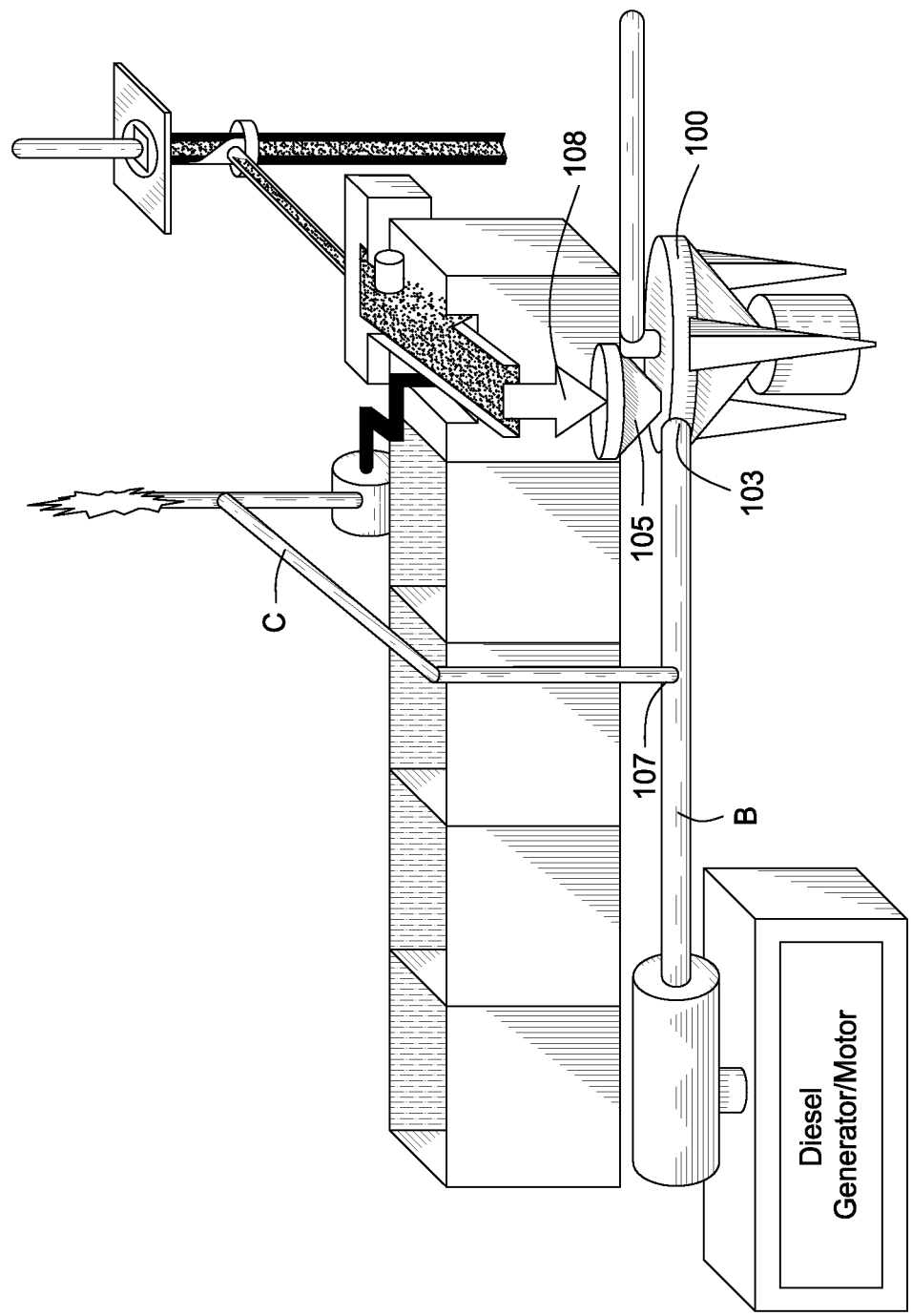
FIG. 11 is an illustration of an embodiment of the Plasma Whirl Reactor for Upgrading Crude at the Wellhead.
Figure 12:
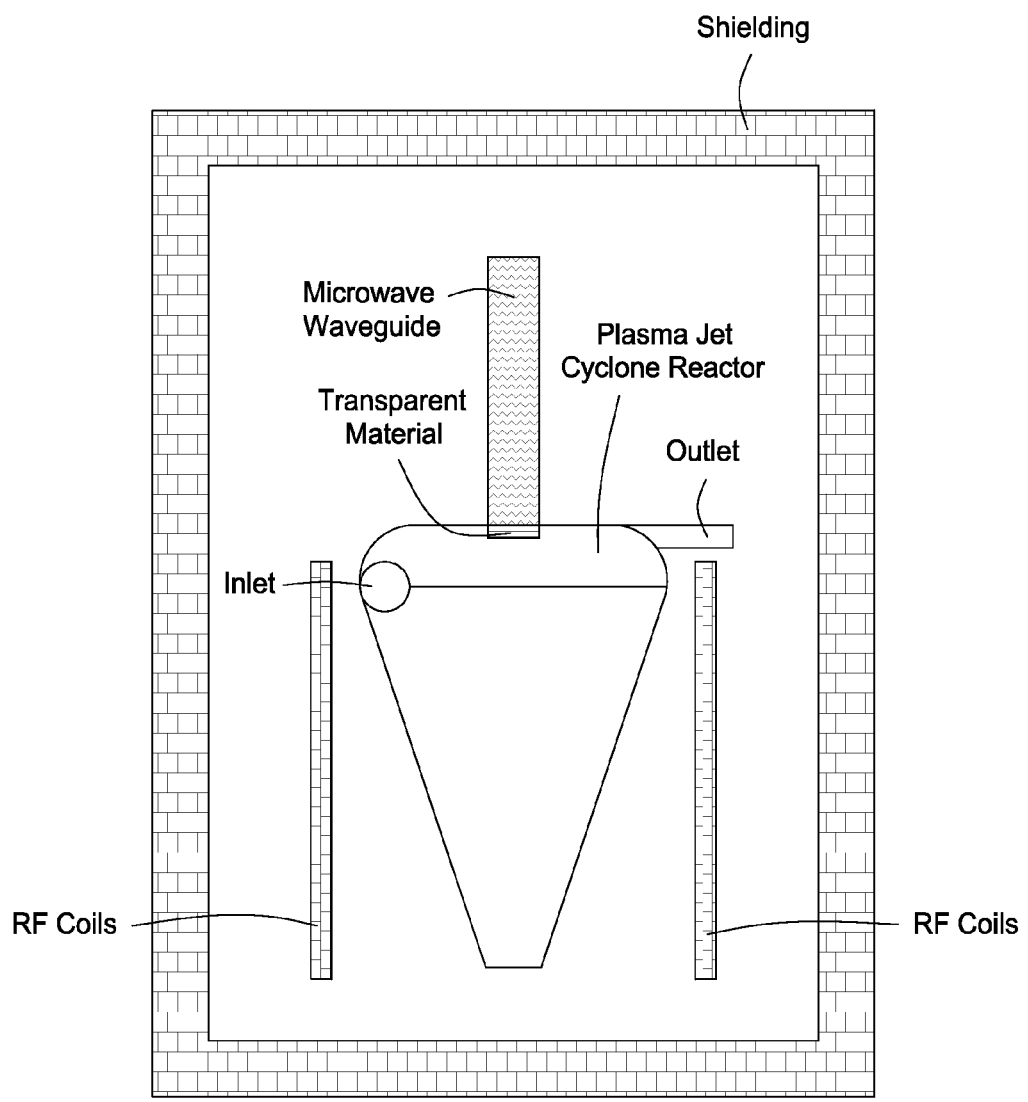
FIG. 12 is an illustration of an embodiment of a Plasma Whirl Reactor for Treating Radioactive Waste.

The present invention provides a novel apparatus and process for upgrading crude at the wellhead. Referring to FIG. 11 hereof, there is provided a horse-head pumpjack 600 that pulls on a sucker rod 700 that is attached to a bottom-hole oil pump (not shown). Oil from the oil-bearing formation enters into the suction side of the pump and is discharged into tubing 800 that also encases sucker rod 700. However, during the pumping action gases trapped in the crude oil may be released into annulus 900. The crude oil flows up tubing 800 while the gases may flow up annulus 900. Due to piping and engineering designs the gas, which is more commonly called casing-head gas, can cause back-pressure on the well. The back-pressure can be compared to slowly closing a valve on a faucet. Simply, with a faucet the water flow decreases as the valve is closed. As back-pressure increases in the annulus the horsehead pumpjack must work harder to overcome the back-pressure. The casing head gas can be utilized as the carrier gas in the pilot plasma or to provide initial angular momentum prior to energizing the RF coils to increase plasma volume.

Landfills

The present invention can also find use in landfill applications. Currently, many landfills flare the biogas produced from the landfill. Biogas is comprised primarily of methane and carbon dioxide with trace amounts of hydrogen sulfide and hydrogen chloride. Biogas is usually flared because of its low energy value. The low energy value equates to a low market value. The present invention can upgrade biogas to syngas while simultaneously converting MSW to syngas and ash. This eliminates the need for increasing the size of the landfill. Likewise, current landfills can be remediated with the present invention.

Referring to FIG. 6A hereof, the biogas may be used as the fluid for producing angular momentum with jet nozzles. Further, steam or biogas may be used as the carrier gas in the pilot plasma torch. MSW is conveyed to the reactor with a system similar to 107 in FIG. 5 hereof. Any means for conveying that allows the control of the amount of air that enters the reactor can be used. For example, in FIG. 5 hereof, inlet D is used to supply steam to hopper 109 to form a steam blanket for reducing air intake into the reactor. Referring back to FIG. 6, RF coils are energized to increase the plasma volume and increase angular momentum. As a result, the MSW is comminuted, reformed and separated from the syngas in a single vessel. The MSW ash exits the reactor through the bottom outlet while the syngas exits the reactor through the top outlet. The syngas can be further purified with a scrubber. The ash may contain very fine metals, glass, etc. which can be recycled or used as backfill in the landfill.

Practice of the present invention eliminates disposal of MSW into landfills. Further, the apparatus used in the practice of the present invention can be scaled down from a landfill size unit to commercial and residential size units. This would reduce the amount of energy used for the transportation of MSW to landfills. Also, household garbage could be converted to syngas for use as a fuel at home in a small fuel cell or gas turbine engine, thus reducing electrical demand at homes.

Figure 7:
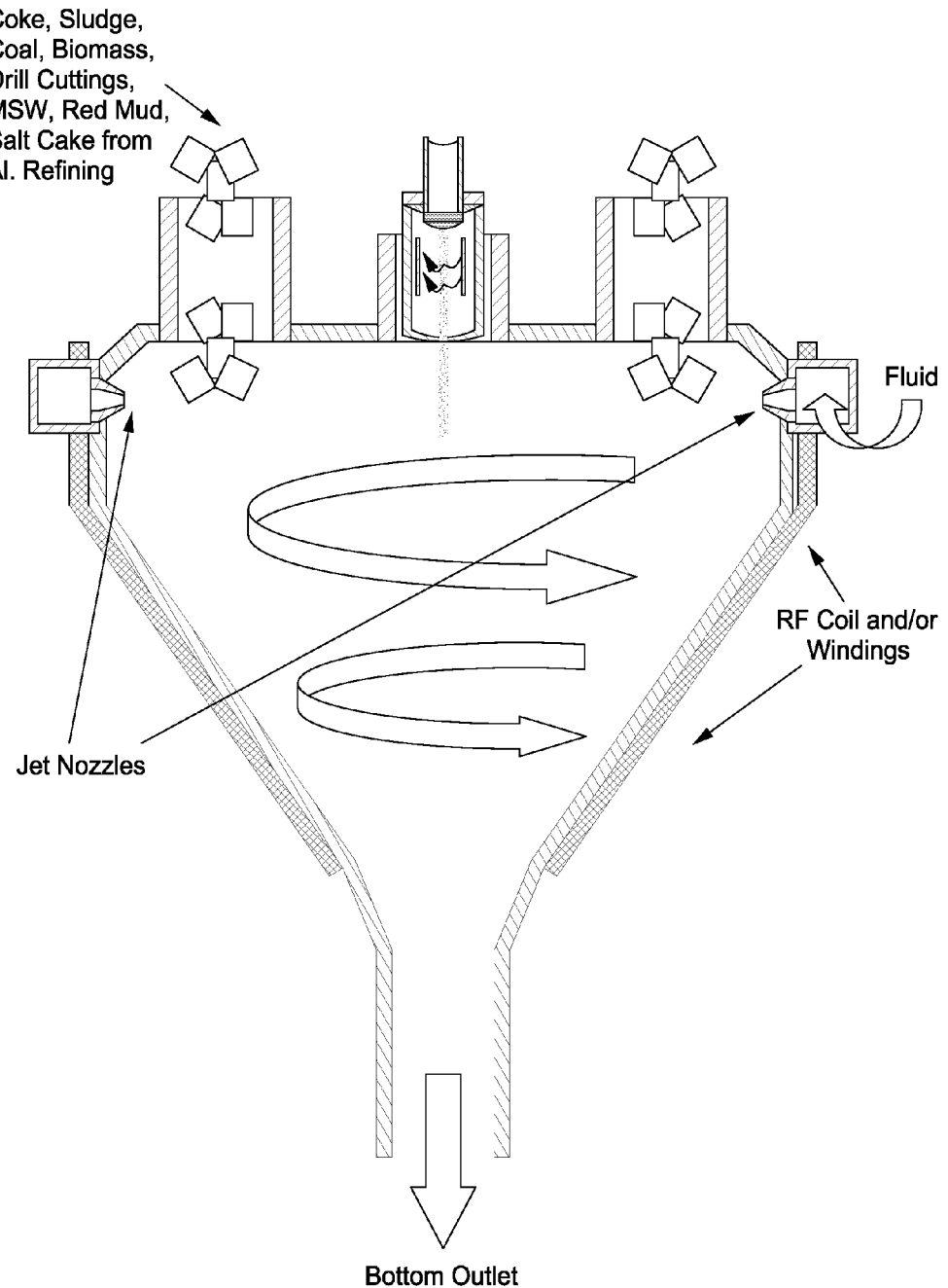
FIG. 7 is a diagrammatic, cross-sectional side view of another embodiment Hyper Plasma Jet Mill Reactor.
Figure 7A:
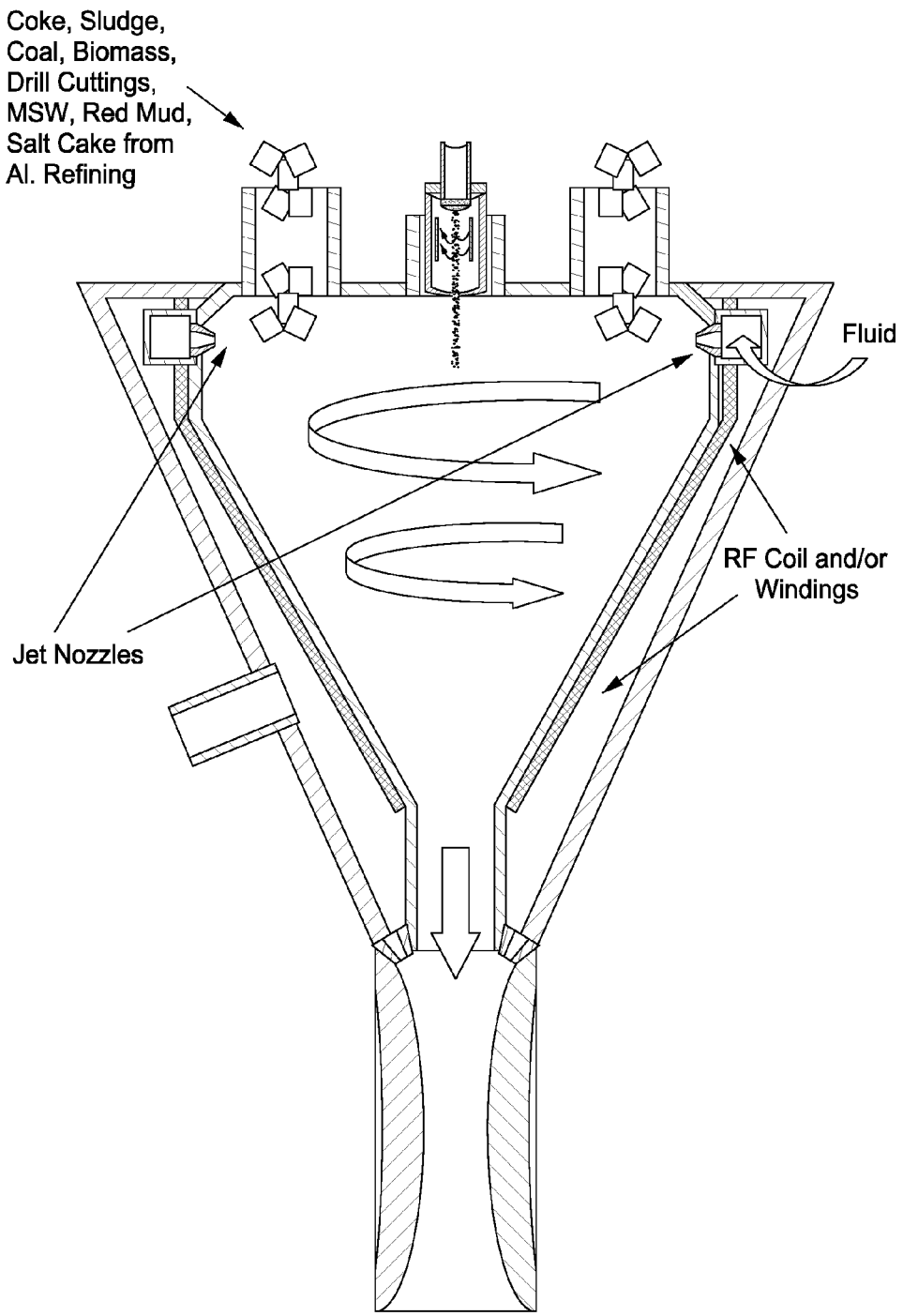
FIG. 7A is a diagrammatic, cross-sectional side view of another embodiment Hyper Plasma Jet Tornado Eductor Reactor.

An eductor (not shown) can be attached to the top outlet or bottom outlet or both to perform several functions in the apparatus represented in FIG. 6A hereof. FIG. 7A hereof 15 shows such a system. An eductor is attached to the outlet of the reactor. It will be understood that the eductor maybe fabricated as an integral part of the reactor.

By attaching the eductor to the reactor several unexpected results can occur. First, the pilot plasma can be further radially constricted and axially lengthened to the point of reaching the eductor jets. Second, depending upon the type of eductor motive fluid used, reactions can be quenched immediately. Third, the eductor motive fluid and the eductor can be used as a direct heat recovery method. Fourth, by selecting an ideal eductor such as a Peri-Jet® Eductor manufactured by Derbyshire, Inc., the plasma can be entrained into the motive fluid. This opens the door for numerous applications. For example, the Plasma Whirl Reactor of the present invention can be used with substantially pure oxygen to produce atomic oxygen. Drinking water or wastewater effluent that must be disinfected can be disinfected with the atomic oxygen. Next to flourine, atomic oxygen has the second highest oxidation potential.

Some unexpected results for this application can be summarized as follows:

1. The central plasma vortex is constricted and lengthened due to angular momentum provided by both the jets and RF coils.
2. The high plasma temperature at the core of the vortex keeps the oxygen molecule dissociated into atomic oxygen.
3. By coupling the plasma with the eductor motive fluid the atomic oxygen can enter the water as atomic oxygen for disinfection purposes.

Ethylene Oxide Plant

Figure 8:
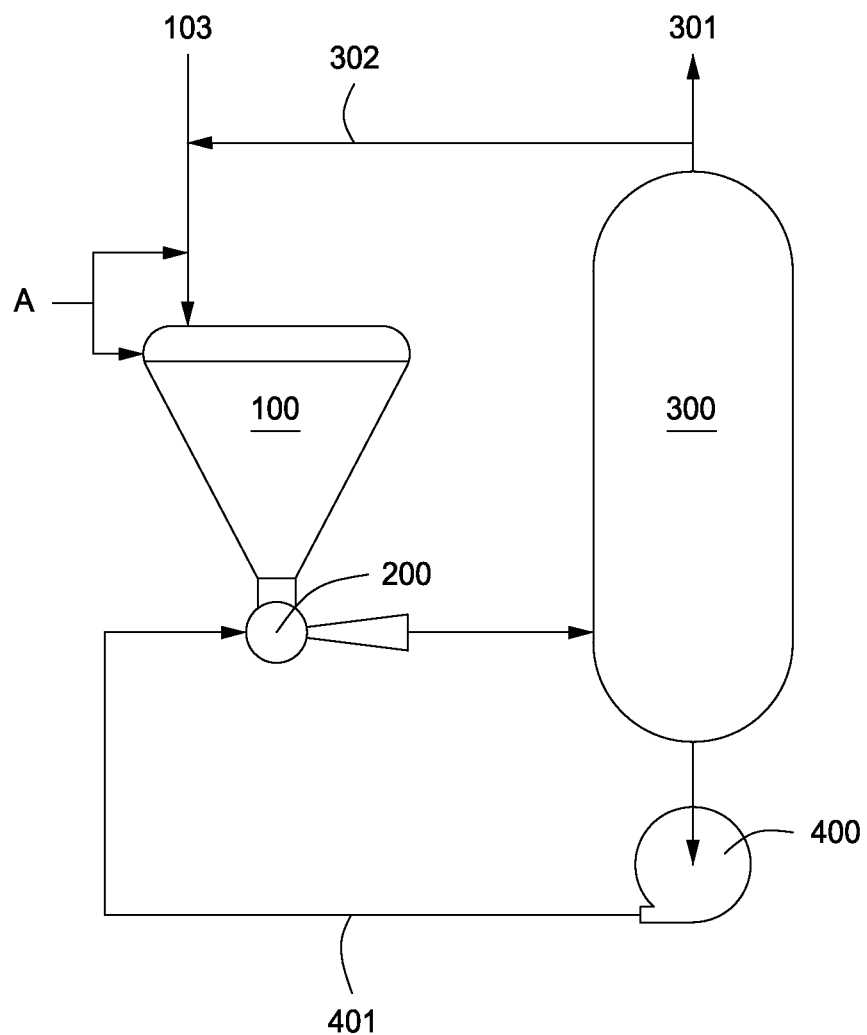
FIG. 8 is a diagrammatic, process flow of an embodiment Plasma Jet Mill Eductor & Scrubber/Quencher.
Figure 9:
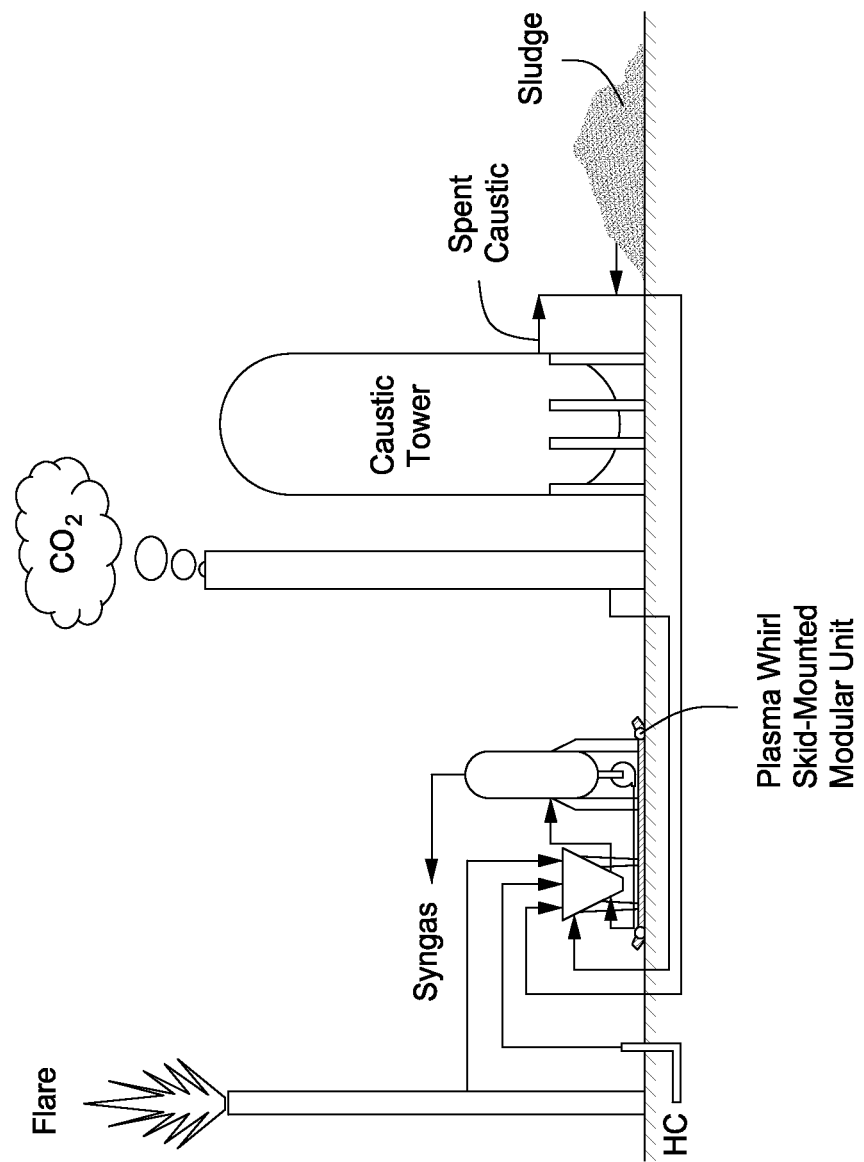
FIG. 9 is an illustration of an embodiment of the Plasma Whirl Reactor in an Ethylene 15 Oxide Plant utilized as a Zero Release Method.

Referring to FIGS. 8 and 9 hereof, the present invention can be practiced in one of its most preferred modes—simply as a $CO_2$ reformer in an ethylene oxide plant. The bottleneck in most ethylene oxide plants is the production of $CO_2$. Some ethylene oxide plants may have trace amounts of ethylene oxide within the $CO_2$ released to the atmosphere. The present invention provides a solution for achieving substantially zero emissions.

Scrubber 300 is filled with a suitable scrubbing solution selective to remove carbon monoxide, carbon dioxide or both. Non-limiting scrubbing solutions that can be used herein include those based on an amine or ethanol. $CO_2$ from the ethylene oxide plant is flowed into the reactor via inlet 103. Methane, or any other hydrocarbon source, is flowed into the reactor via A or 110 (shown in FIG. 3 hereof). The ethylene oxide contaminant within the $CO_2$ is reformed in combination with the $CH_4$ and $CO_2$ to form hydrogen and carbon monoxide. The syngas is purified with the scrubbing solution. Next, the purified syngas is piped to an end user such as a refinery 301 and/or feed back into the system 302. It will be understood that the CO can be steam reformed to $CO_2$ and $H_2$. It will also be understood that any VOC streams that are flared within the plant can be used to replace the methane stream. Thus, this would eliminate and achieve zero discharge for both $CO_2$ and flares.

If the EO plant desires to produce a substantially pure hydrogen stream while simultaneously capturing the carbon, the present invention can be operated in a carbon sequestration mode. This can be accomplished by the addition of red mud, or a source of calcium oxide or magnesium oxide.

Spent Caustic Wastes

Many petroleum refineries use a water solution of sodium hydroxide (caustic soda) to treat light products such as gasoline. In its basic form, caustic treating of gasoline involves washing the gasoline with a solution of caustic, followed by a water wash of the gasoline to remove any residual caustic from the gasoline product. Caustic treating neutralizes and removes acidic compounds contained in the gasoline, such as phenols (crysilic acids), hydrogen sulfide, hydrogen cyanide, carbon dioxide and mercaptans. A number of variations of the basic caustic treating process and various treating technologies are available. Depending on the refinery configuration and the processes used, the production of spent caustic can be in the range of 3 gallons to 70 gallons of spent caustic per barrel of crude oil processed, and can be produced on a semibatch or continuous basis.

Spent caustic from gasoline treating contains the sodium salts of various acids, soluble gasoline components, dimers of mercaptans (disulfides) and unreacted caustic. Although refinery spent caustic usually is not considered a RCRA hazardous waste, it is corrosive and can generate explosive vapors. If acidified, toxic gases such as hydrogen cyanide and hydrogen sulfide can be generated.

In ethylene plants, acid gases ($CO_2$ and $H_2S$) are treated in an absorber using a mild caustic solution. The spent caustic becomes saturated with an array of hydrocarbon components including heat sensitive polymer precursors and monomers such as carbonyls, dienes, and styrenics. The presence of organics in the spent caustic acts as a poison to appreciably retard the preferred oxidation chemistry in downstream wet air oxidation (WAO) reactors, and would also cause polymer formation and fouling of the reactors. These organics also make the solution environmentally hazardous and thus limits its use for integration with the pulp and paper industry or other metal treatment processes. Therefore, it is essential to free the spent caustic from dissolved polymer precursors and their monomers prior to WAO or if the spent caustic is to be used for alkali content.

Aluminum, Red Mud, $TiO_2$ and Carbon Sequestration

Referring again to FIG. 6A hereof, a hydrocarbon source, such as flare gas, is used as the fluid for producing angular momentum with jet nozzles. Steam may be used as the carrier gas in the pilot plasma torch. Red Mud is conveyed to the reactor with a system similar to 107 in FIG. 5 hereof. Any means of conveying that allows for control of the amount of air that enters the reactor can be used. For example, in FIG. 5, inlet D is used to supply steam to hopper 109 to form a steam blanket for reducing air intake into the reactor. Returning to FIG. 6 hereof, RF coils are energized to increase the plasma volume and increase angular momentum. As a result, the Red Mud is comminuted while simultaneously allowing the calcium oxide and magnesium oxide within the red mud to capture carbon dioxide formed during the cracking, reforming and water-gas shift reactions.

The Red Mud byproduct exits the reactor through the bottom outlet while the hydrogen exits the reactor through the top outlet. The hydrogen stream can be further purified with a scrubber. The Red Mud byproduct can now be used for absorbing liquid wastes such as oil spills. Not wishing to be bound by theory, it is believed that the Red Mud can be utilized in situ in the present invention to enhance hydrocarbon synthesis. For example, Red Mud contains metals, which are used in present day catalysts for Olefins production.

Conventional fluidized bed process units for olefin production are such that the solids residence time and the vapor residence time cannot be independently controlled, especially at relatively short vapor residence times. For the production of olefins it is preferred that the vapor remain in the reactor for less than a second while the catalyst remains in the reactor for a longer period of time. Typically, the catalyst may remain in the reactor from 15 to 60 seconds.

The present invention's reactor as shown in FIG. 4, 5, or 6 hereof may be well suited for carrying out the aforementioned production of olefins. Not wishing to be bound by theory, it is believed that olefin production can be enhanced in the following manner:

1. Use the olefin feedstock to generate Plasma Whirl;
2. Plasma Whirl produces angular momentum;
3. Red Mud is conveyed to the reactor to be comminuted and separated in the plasma whirl due to centrifugal force;
4. Red Mud remains in the reactor longer due to centrifugal force;
5. Red Mud and Olefins exit the center of the reactor; and
6. The materials are flowed such that olefins production is maximized while methane production is minimized.

Also, in another mode, Red Mud can be used in the present invention for the production of substantially pure hydrogen. It is well known that the production of aluminum is energy intensive. Aluminum smelters require a low DC voltage. The present invention allows for an alumina or aluminum plant to become a so-called "Over-The-Fence" hydrogen producer. The present invention can be mobilized onsite at the alumina plant or at the most economical site with respect to the source of the organic or hydrogen containing material. For example, the apparatus of the present invention can be located near a petroleum refinery. The refinery provides coke as the carbon source for the apparatus. The coke and Red Mud are flowed into the reactor. The final products are treated Red Mud and hydrogen.

An aluminum plant may opt to install the apparatus of the present invention onsite or near a coal burning power plant. A relatively cheap source of carbon, such as coal fines, produced from coal burning power plants may be used as the carbon source. However, aluminum plants located in a forested region, such as the U.S. Pacific Northwest, may opt to use a virgin product such as wood chips as the carbon source. If installed onsite at an aluminum facility, the apparatus allows for the ideal production of aluminum with respect to energy conservation and environmental emissions. In lieu of burning the hydrogen as fuel in a boiler or gas turbine engine, it would be highly advantageous to use the hydrogen in a fuel cell. Since fuel cells produce a low voltage DC source of electricity and aluminum smelters utilize 5 volts DC, then this application of the present invention allows for an ideal use.

Additionally, the Red Mud may be slurried with waste oil or a crude oil with a low API gravity and flowed into the Plasma Whirl Reactor of the present invention. The Red Mud byproduct can then be used for mopping up oil spills and subsequently allowing for recovering the energy value of the oil by processing the oil absorbed in the Red Mud in the apparatus of the present invention. It has been demonstrated that in combination with the present invention, Red Mud can become a valuable commodity for an aluminum plant and may no longer be viewed as a waste disposal problem.

Not wishing to be bound by theory, it is believed that the $TiO_2$ in the Red Mud treated by the present invention, may be separated from the iron and alumina and recovered from the Red Mud. This further enhances the value of the Red Mud when processed through the present invention's apparatus or method.

Refinery Spent Acid Regeneration and Claus Plant

The present invention can also be applied as a spent acid regeneration plant in a refinery. As previously mentioned, the bottleneck in most SAR plants is the volume of gas produced due to combusting the spent acid with a fuel and oxidant. The present invention provides a solution for the problems inherent in modern day SAR plants. In FIG. 2 hereof, spent acid can be pressurized and used as the fluid for providing angular momentum to the reactor. The jet nozzle ring is designed such that pressurized spent acid fluid is atomized after exiting the nozzles and upon entry into the reactor. In this mode, a waste inlet may not be needed since the pressurized spent acid fluid is the waste.

Referring to FIGS. 3, 3A, 3B and 3C hereof, pilot plasma gas A is conveyed to the pilot plasma torch 102 to create pilot plasma 101. The pilot plasma gas A may be selected from $SO_2$, $H_2S$, steam, $O_2$, $CO_2$ or any gas commonly found in a refinery. The most preferred gas is one with a low ionization potential and which does not add an unwanted gas and an increased gas volume to the SAR plant.

Spent acid B is pressurized and conveyed into the reactor via inlet 103. The spent acid is atomized upon exiting the nozzles or slits 104. This creates angular momentum within the reactor. Once again, the pilot plasma 101 is elongated and constricted along the longitudinal axis to form the elongated pilot plasma 101A. Upon energizing the RF coils 105, the plasma volume increases dramatically, which further increases angular momentum. The large plasma 101B is created with the atomized spent acid. Thus, the spent acid B must transition through the large plasma 101B and the elongated plasma 101A in order to exit the reactor.

Referring again to FIG. 6A hereof, the reactor can be configured to remove any solids or ash present in the spent acid. Once again, the spent acid fluid enters the reactor via jet nozzles that are tangentially aligned to impart angular momentum to the reactor (similar to plasma torches shown in FIG. 1 hereof). Upon exiting the jet nozzles, the spent acid fluid is atomized, entrained and converted into a plasma via wave energy provided by the RF coil. The solids exit the bottom outlet while gases exit the top outlet. It will be understood that a cyclone separator constructed of a refractory material transparent to RF energy may be used in the present invention.

In another embodiment of the present invention, the reactor can be configured in accordance with FIG. 7A hereof and adapted to a scrubber or absorption tower 300 as shown in FIG. 8 hereof. For example, the tower or scrubber 300 may be filled with a solution selective to modern day SAR plants for dehydrating a $SO_2$ stream.

In another preferred embodiment, the plasma whirl reactor opens the door for integrating an $H_2S$ stream into a SAR plant. The SAR plant and Claus plant are separate operating units in a refinery. However, the reactions and products of the two plants can easily be integrated into one unit.

The decomposition reaction for combustion of $H_2SO_4$ is:

$H_2SO_4 + heat \rightarrow SO_2 + H_2O + O$.

The partial oxidation reaction for $H_2S$ in a Claus plant is:

$H_2S + [O] \rightarrow H_2O + S$.

Not wishing to be bound by theory, it is believed that feeding $H_2S$ stoichiometrically with spent sulfuric acid in the Plasma Whirl Reactor of the present invention can produce the following reaction and products:

$H_2SO_4 + H_2S + \text{wave energy (heat)} \rightarrow SO_2 + 2H_2O + S(s)$.

Since the $H_2SO_4$ provides the oxygen for partial oxidation of $H_2S$ to water and sulfur, either reactant can be controlled to optimize plant conditions. Also, this novel application of the Plasma Whirl Reactor substantially reduces the size of the spent acid regeneration plant as well as the Claus plant.

For example, by utilizing the plasma cyclone separator reactor, it is believed that the sulfur can be separated from the $SO_2$ and $H_2O$ in situ. It will be understood that the organics in the spent acid may be converted to carbon and hydrogen or react with the $H_2O$ to form syngas. Since hydrogen and carbon monoxide or both powerful reducing agents, then both may want to react with the $SO_2$ to shift back to $H_2S$ and $O_2$ or $H_2S$ and $CO_2$. By adding a stoichiometric amount of $O_2$ to further react with the syngas the reaction can be driven to near completion.

In addition, a sufficient amount of $O_2$ may be added to the reactor in order to oxidize the solid sulfur, in order to maximize $SO_2$ production while minimizing solid sulfur production. Or the $H_2S$ may be fed to the plasma whirl reactor at a rate less than $H_2SO_4$ feed. As a result the oxygen will react with hydrogen and carbon monoxide to form H2O and $CO_2$. Next, the $SO_2$ rich stream may be scrubbed to remove water and to cool the stream to an ideal temperature for conversion to $SO_3$ in the downstream converter. However, it will be understood that a heat recovery unit may be installed upstream of the scrubber in order to recover the heat value of the stream. After dehydration of the S $O_2$ rich stream, air or oxygen may be added in order to oxidize $SO_2$ to $SO_3$ in the converter. It will be understood that dilution air may be added before the dehydration process. The purpose of adding air after or during cooling is to avoid the production of nitrogen oxides.

The present invention can also be used to recover spent catalysts, such as Group VIII/Group VI hydrotreating catalysts from petroleum and petrochemical streams.

The present invention can also be used in Spent Acid Regeneration which overcomes the obstacles in modern day SAR combustion furnaces. Quite simply the energy is added in the form of wave energy vice in the form of a fuel and oxidant. Additionally, since air is not added in the plasma whirl reactor, an unsuspected result occurs. NOx is not produced, thus this eliminates the environmental problems associated with NOx production due to high temperatures associated with current refinery Claus and SAR plants operations.

Agriculture and Forestry Wastes—Bagasse, Rice Straw, Poultry Litter, Wood Chips and Black Liquor A primary problem associated with burning agriculture and forestry wastes in boilers is the moisture content of the waste. Another problem associated with burning agriculture wastes is the composition of the waste. Agriculture and forestry waste that present special problems are bagasse from sugarcane mills, rice straw, rice hulls, animal litter and black liquor from pulp and paper mills.

Forest—Pulp and Paper—Wood Chips and Black Liquor

Pulp and paper production is among the most energy intensive segments of all manufacturing industries. Combustion of kraft black liquors is primarily done to recover chemicals for cooking. Without chemicals recovery, the process would be uneconomical. However, in recent years, the efficiency of black liquor combustion has been improved so that now mills are more nearly energy self-sufficient. Black liquor combustion is combined with the combustion of bark and other wood fuels.

The black liquid recovery boiler presents problems of operation and safety that far exceed those of the conventional power boiler. In January 1962, the Black Liquid Recovery Boiler Advisory Committee (BLRBAC) was formed by representatives of the pulp and paper industry, manufactures of black liquid recovery boilers and insurance companies providing coverage on black liquor recovery boilers. The BLRBAC periodically updates a report titled "Safe Firing of Black Liquor in Black Liquor Recovery Boilers." The last update was March 2001. On page 65 of the report, the BLRBAC strongly recommends that water solutions (i.e. black liquor soap) should never be injected directly into a kraft recovery furnace.

In 1997 the BLRBAC established the Waste Streams Subcommittee to evaluate the experience with thermal oxidation of liquid and gaseous waste streams in the recovery furnace, and if the experience supported developing recommended BLRBAC guidelines for using the recovery boiler as an emissions control device. The outcome of the subcommittee was another excellent advisory published by the BLRBAC on Oct. 6, 1999 titled, "Recommended Good Practice For The Thermal Oxidation of Waste Streams In A Black Liquor Recovery Boiler."

In part the Thermal Oxidation of Waste Streams advisory stated, "The major waste stream is non-condensible gases (NCG), which are gases that contain reduced sulfur compounds from the digester and evaporator operations and are also a source of odor. The principal process benefit to thermally oxidizing waste streams in the recovery furnace is that the sulfur content of the streams can be retained within the process rather than be discharged to the surroundings. . . . The largest volume waste stream available for disposal is the collected Dilute Noncondensible Gas (DNCG) streams from various sources in the kraft mill."

On page 3, BLRBAC stated, "The burning of dilute and/or concentrated noncondensible gases or other waste streams in the kraft black liquor recovery boiler adds complexity and potential hazards to the operation. Recognizing this, BLRBAC does not encourage the practice. However, if noncondensible gases or any waste stream are burned in the recovery boiler, this recommended good practice should be followed to assist in minimizing the potential for accidents."

Deadly gas explosions are the greatest hazard in operating kraft recovery furnaces. Likewise, the most prevalent cause of explosions when utilizing the furnace for thermal oxidation of NCG is the presence of terpenes (turpentine vapor). Static electricity or an electrical spark or reaching the auto-ignition temperature of 487° F. of the pinene can lead to an explosion. The upper and lower explosion limits for turpentine vapor are not very well defined, but the explosion range is known to be very wide.

The $SO_2$ produced in a recovery boiler during the thermal oxidation of black liquor is scrubbed by the alkali fume present in the upper furnace to form sodium sulfate ($Na_2SO_4$). Simply, the feed streams to the furnace also act as scrubbing chemicals. The limiting factor for $SO_2$ scrubbing is the amount of alkali hydroxides, sodium and potassium, that are present in the furnace. The report stated, "In general, furnaces that burn hotter (those with higher black liquor solids) will volatilize more sodium and in turn have a higher sulfur capture efficiency . . . . The high sulfur capture efficiency is one of the factors that make incineration of NCG in the recovery furnace an attractive alternative."

Although there are many reactions that occur in the recovery boiler, the primary goal is to maximize smelt production for transforming the smelt into green liquor and then into white liquor. Thus, the pulp and paper mill's caustic area has a main objective of converting sodium carbonate ($Na_2SO_3$) to sodium hydroxide by slaking calcium oxide (CaO) to form calcium hydroxide (CaOH). The CaOH is then reacted with the $Na_2SO_3$ to form sodium hydroxide (NaOH). The calcium carbonate ($CaCO_3$) also known as lime mud is converted to CaO and $CO_2$ in a rotary kiln. This last step is known as calcination.

Referring again to FIG. 1 hereof, black liquor can be injected into the inlet and converted to smelt. The plasma torches that are aligned tangentially utilize $CO_2$, steam, turpine vapors or noncondesible gases as the carrier gas. Although not shown the smelt exits the bottom while gases exit the top outlet.

Referring again to FIG. 6A hereof, black liquor is injected into the reactor via jet nozzles that are aligned tangentially to create a vortex. Wood chips or any other wastes are conveyed and injected into the reactor through a secondary inlet. Once again gases exit the top outlet while solids such as smelt exit the bottom outlet.

The present invention also gives rise to a novel hydrogen production facility at a pulp and paper mill. Not wishing to be bound by theory, it is believed that the addition of CaO to the reactor will produce $CaCO_3$ and $H_2$. The $CO_2$ that reacts with the CaO is the product of reacting carbon and oxygen which are part of the black liquor. Additional steam may be added to the reactor to increase $H_2$ production. The sodium and sulfide may be recovered directly as caustic soda and sodium sulfide from the bottom of the reactor.

However, a pulp and paper mill can save on lime costs by simply using red mud. The process for producing hydrogen from red mud has been previously explained. Simply, the black liquor provides the source of carbon necessary in the reaction. A benefit to this process is that the mill may produce $TiO_2$ that is suitable for use in paper products. Thus, the mill saves on the cost of purchasing both lime and $TiO_2$.

Sugar Mill Bagasse

Two major problems are associated with burning bagasse in boilers. First, the bagasse contains 50% moisture. Thus, boilers must be sized accordingly in order to handle the additional the additional flue gases produced due to the moisture (steam). This results in a very large boiler. Likewise, bagasse is not finely ground in modern day mills. As a result, it is common to find large clinker production in modern day sugarcane mill boilers. Also, mills produce a very large volume of bagasse. Typically, a 10,000 ton day cane mill will produce about 1,500 tons per day of bagasse. Thus, the boiler is operated as an incinerator in order to eliminate the bagasse and prevent stockpiling of the cane stalk residue.

Rice harvesting and milling produces two products that present problems. Rice straw is difficult to feed to a boiler. Rice hulls have a high silica content that also results in clinker formation.

Animal litter presents a problem unique to operating conditions. First, Animal Feed Operations (AFOs) range from very small operators (300 head of cattle or less) to operations that may have greater than 10,000 animals in a confined feeding location. Likewise, AFOs range from poultry feed houses to very large commercial dairy operations. Thus, the amount of litter or manure produced at each facility varies dramatically.

The present invention's modular plasma whirl reactor allows for scaling up and down quite easily. Thus, the various solid, liquid and gaseous wastes and volumes produced at sugar mills, poultry houses, rice mills, rice farms, or at pulp and paper mills can be converted to syngas without the need for pretreating the wastes by utilizing the present invention's plasma whirl reactor.

Referring again to FIG. 5 hereof, wet bagasse or any of the aforementioned agriculture and forestry wastes, can be fed into the inlet. The moisture in the bagasse is utilized to react with the carbon in the bagasse fiber to form syngas. Pretreatment methods such as drying or grinding are not necessary or required in the present invention. In addition, there are several benefits derived from operating the plasma whirl reactor as a bagasse gasifier. First, the syngas produced from the plasma whirl reactor can be used a fuel for a very small package boiler or gas turbine engine in lieu of a large boiler. Second, the finely comminuted fly ash produced in the plasma whirl reactor can be utilized as a cement additive.

Another unsuspected but highly desirable result is achieved with the plasma whirl reactor of the present invention. It is well known that many jet mills have a difficult time processing non-friable material. Friable simply means a material that can be crushed into a powder. For example, wet bagasse is not a friable material. However, when processed in the Plasma Whirl Reactor, as the bagasse is converted to char or charcoal, a friable material, the bagasse ash is then finely comminuted to a fly ash powder. Thus, the problem of producing large clinker from burning bagasse in typical boilers does not occur in the plasma whirl reactor.

Cement Plant

Based upon this unsuspected result, the plasma whirl reactor may be an ideal solution for replacing long rotary kilns used in the production of cement. In lieu of a rotating kiln and pug mill, the material is simply added to the plasma whirl reactor to form powered clinker (cement). Thus, the process eliminates the long rotating kiln and the pug mill that crushes the clinker.

The present invention has disclosed a novel plasma whirl comminution reactor and method, which can comminute, separate, react, sequester and quench in one vessel. The foregoing description of the preferred and various alternative embodiments and variation in the apparatus of the invention, and the foregoing description of a variety of processes for which the invention may be advantageously employed, is intended to be illustrative and not limiting. It is to be understood that the apparatus of the invention is susceptible to other alternative embodiments and variations, and that thy invention may be applied to various process objectives in addition to those specifically described, all within the scope of the invention as defined by the appended claims.

What is claimed is:

1. An apparatus for producing a clinker for cement from a material comprising:
    a vessel having an interior defined by a cylindrical portion disposed proximate to a first end and a cone shaped portion disposed proximate to said cylindrical portion that forms a first outlet at a second end that is aligned with a longitudinal axis of said cylindrical portion and said cone shaped portion, one or more inlets in said first end to receive said material, and a second outlet at said first end that is aligned with said longitudinal axis of said cylindrical portion;
    a first plasma source comprising a plasma torch connected to said first end and aligned with said longitudinal axis of said cylindrical portion and said cone shaped portion to introduce a plasma into said interior;
    a second plasma source comprising a set of radio frequency coils disposed around or within said cylindrical portion to add energy to said plasma; and
    two or more jets or slits within said cylindrical portion to direct a fluid or a gas into said interior to create angular momentum in said plasma to form a plasma vortex that circulates around said longitudinal axis and reacts with said material to produce said clinker for cement that exits through said first outlet in said second end.

2. The apparatus of claim 1, further comprising a tube disposed between said first end and said plasma torch, said tube having two or more inlets or slits within said tube to direct a carrier gas into said tube to create angular momentum in said plasma before said plasma enters said interior of said vessel.

3. The apparatus of claim 1, further comprising a second plasma torch disposed within said outlet at said second end and aligned with said longitudinal axis of said cylindrical portion and said cone shaped portion to introduce a second plasma into said interior of said vessel.

4. The apparatus of claim 1 further comprising an eductor with a longitudinal axis, connected to said vessel at said second end around said outlet opening with said longitudinal axis of said eductor in coaxial alignment with said longitudinal axis of said cylindrical portion and said cone shaped portion of said vessel.

5. The apparatus of claim 1, wherein said carbon-based material is fed into said inlet using a conveyor, a hopper, a gravity feed, a fluid, a gas, steam or a combination thereof.

6. The apparatus of claim 1, wherein each plasma source comprises an AC plasma torch, DC plasma torch, a microwave plasma torch, an inductively coupled plasma torch or a combination thereof.

7. The apparatus of claim 1, wherein said plasma vortex circulates around a central void.

8. The apparatus of claim 1, wherein each plasma source comprises a plasma jet nozzle fed by a fluid.

9. The apparatus of claim 8, wherein said fluid comprises water, steam, carbon dioxide, air, oxygen, nitrogen, hydrogen, helium, volatile organic carbon, an ionizable fluid, an ionizable gas or a combination thereof.

10. An apparatus for producing a clinker for cement from a material comprising:
    a vessel having a vertical longitudinal axis, a cylindrical middle portion aligned with said vertical longitudinal axis, a top portion, a bottom portion, one or more inlets disposed in said top portion to receive a material, a top outlet aligned with said vertical longitudinal axis and disposed in said top portion, and a bottom outlet aligned with said vertical longitudinal axis and disposed in said bottom portion;
    two or more plasma torches mounted tangentially in said cylindrical middle portion such that said plasma torches are substantially aligned with one another in a horizontal plane with respect to said vertical longitudinal axis; and
    wherein said plasma from said plasma torches combine together to create sufficient angular momentum to form a plasma vortex that circulates around said vertical longitudinal axis within said vessel and reacts with said material to produce said clinker for cement that exits through said bottom outlet.

11. The apparatus of claim 10, wherein said material is fed into said one or more inlets using a conveyor, a hopper, a gravity feed, a fluid, a gas, steam or a combination thereof.

12. The apparatus of claim 10, wherein each plasma torch comprises an AC plasma torch, DC plasma torch, a microwave plasma torch, an inductively coupled plasma torch or a combination thereof.

13. The apparatus of claim 10, wherein:
    said bottom portion is cone shaped or substantially flat; or
    said vessel is pancake-shaped, cylindrically-shaped or shaped like a cyclone separator.

14. The apparatus of claim 10, further comprising a set of radio frequency generating coils disposed around an exterior of said circular middle portion, or said circular middle portion and at least a portion of said bottom portion.

15. The apparatus of claim 10, wherein said plasma vortex circulates around a central void.

16. The apparatus of claim 10, further comprising another plasma source disposed within said outlet and aligned with said vertical longitudinal axis.

17. The apparatus of claim 10, further comprising an eductor attached to said bottom outlet and aligned with said vertical longitudinal axis.

18. The apparatus of claim 10, wherein said two or more plasma torches comprise a first set of plasma torches and said horizontal plane is a first horizontal plane, and further comprising a second set of two or more plasma torches mounted tangentially in said cylindrical middle portion either above or below said first set of plasma torches such that said second set of plasma torches are substantially aligned with one another in a second horizontal plane with respect to said vertical longitudinal axis, and wherein said second set of plasma torches are fed by said fluid or gas, atomize said fluid or gas and direct said atomized fluid or gas into said interior of said vessel.

19. An apparatus for producing a clinker for cement from a material comprising:
   a vessel having a vertical longitudinal axis, a cylindrical middle portion aligned with said vertical longitudinal axis, a top portion, a bottom portion, one or more inlets disposed in said top portion to receive a material, a top outlet aligned with said vertical longitudinal axis and disposed in said top portion, and a bottom outlet aligned with said vertical longitudinal axis and disposed in said bottom portion;
   two or more jet nozzles mounted tangentially in said cylindrical middle portion such that said jet nozzles are substantially aligned with one another in a horizontal plane with respect to said vertical longitudinal axis, wherein said jet nozzles are fed by a fluid or gas, atomize said fluid or gas and direct said atomized fluid or gas into an interior of said vessel;
   a radio frequency source proximate to said plasma jet nozzles to generate a plasma from said atomized fluid or gas within said vessel; and
   wherein said plasma from said atomized fluid or gas from said jet nozzles combines together to create sufficient angular momentum to form a plasma vortex that circulates around said vertical longitudinal axis within said vessel and reacts with said material to produce said clinker for cement that exits through said bottom outlet.

20. The apparatus of claim 19, wherein said material is fed into said one or more inlets using a conveyor, a hopper, a gravity feed, a fluid, a gas, steam or a combination thereof.

21. The apparatus of claim 19, wherein said plasma vortex circulates around a central void.

22. The apparatus of claim 19, wherein said fluid or gas comprises water, steam, carbon dioxide, air, oxygen, nitrogen, hydrogen, helium, volatile organic carbon, an ionizable fluid, an ionizable gas or a combination thereof.

23. The apparatus of claim 19, wherein said radio frequency source comprises a set of radio frequency generating coils disposed around an exterior of said circular middle portion, or said circular middle portion and at least a portion of said bottom portion.

24. The apparatus of claim 19, wherein the radio frequency source comprises a microwave plasma torch.

25. The apparatus of claim 19, wherein said two or more jet nozzles comprise a first set of jet nozzles and said horizontal plane is a first horizontal plane, and further comprising a second set of two or more nozzles mounted tangentially in said cylindrical middle portion either above or below said first set of jet nozzles such that said second set of jet nozzles are substantially aligned with one another in a second horizontal plane with respect to said vertical longitudinal axis, and wherein said second set of jet nozzles are fed by said fluid or gas, atomize said fluid or gas and direct said atomized fluid or gas into said interior of said vessel.

26. An apparatus for producing a clinker for cement from a material comprising:
   a vessel having an interior defined by a cylindrical portion disposed proximate to a first end and a cone shaped portion disposed proximate to said cylindrical portion that forms a second outlet at a second end that is aligned with said longitudinal axis of said cylindrical portion and said cone shaped portion, a first outlet in said first end that is aligned with a longitudinal axis of said cylindrical portion and said cone shaped portion, and at least one inlet in said first end to receive a material;
   a set of radio frequency coils disposed around or within said cylindrical portion and said cone shaped portion to generate a plasma from an atomized fluid or gas within said interior; and
   two or more jets or slits mounted tangentially in said cylindrical portion to atomize a fluid or gas and direct said atomized fluid or a gas into said interior to feed said plasma and create angular momentum in said plasma to form a plasma vortex that circulates around said longitudinal axis and reacts with said material to produce said clinker for cement that exits through said second outlet in said second end.

27. The apparatus of claim 26, wherein said material is fed into said inlet using a conveyor, a hopper, a gravity feed, a fluid, a gas, steam or a combination thereof.

28. The apparatus of claim 26, wherein said plasma vortex circulates around a central void.

29. The apparatus of claim 26, further comprising a plasma torch disposed within said second outlet at said second end and aligned with said longitudinal axis of said cylindrical portion and said cone shaped portion to introduce a second plasma into said interior of said vessel.

30. The apparatus of claim 26, further comprising an eductor attached to said outlet and aligned with said longitudinal axis.

* * * * *